(12) United States Patent
Kim et al.

(10) Patent No.: US 9,978,947 B2
(45) Date of Patent: May 22, 2018

(54) ORGANIC LIGHT EMITTING DISPLAY DEVICE

(71) Applicant: LG Display Co., Ltd., Seoul (KR)

(72) Inventors: JungKeun Kim, Seoul (KR); ChangWook Han, Seoul (KR); DoHan Kim, Gyeonggi-do (KR); YoonHeung Tak, Gyeonggi-do (KR); Jeongdae Seo, Incheon (KR); Hyoseok Kim, Daejeon (KR); Hyeseung Kang, Seoul (KR); Jun Yeob Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 211 days.

(21) Appl. No.: 14/886,420

(22) Filed: Oct. 19, 2015

(65) Prior Publication Data
US 2016/0155950 A1    Jun. 2, 2016

(30) Foreign Application Priority Data

Nov. 27, 2014  (KR) .......................... 10-2014-0167746

(51) Int. Cl.
| | |
|---|---|
| *H01L 51/54* | (2006.01) |
| *C09K 11/06* | (2006.01) |
| *H01L 51/00* | (2006.01) |
| *H01L 51/50* | (2006.01) |
| *H01L 51/52* | (2006.01) |

(52) U.S. Cl.
CPC ...... *H01L 51/0058* (2013.01); *H01L 51/0052* (2013.01); *H01L 51/5084* (2013.01); *H01L 51/5004* (2013.01); *H01L 51/506* (2013.01); *H01L 51/5012* (2013.01); *H01L 51/5044* (2013.01); *H01L 51/5056* (2013.01); *H01L 51/5088* (2013.01); *H01L 51/5278* (2013.01); *H01L 2251/552* (2013.01)

(58) Field of Classification Search
CPC ............... H01L 51/0032; H01L 51/005; H01L 51/0052; H01L 51/0058; H01L 51/50; H01L 51/5004; H01L 51/504; H01L 51/5044; H01L 51/5012; H01L 51/5056; H01L 51/5084; H01L 51/5088; H01L 51/506; H01L 51/5278; H01L 2251/552
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | |
|---|---|---|
| 2007/0009762 A1 | 1/2007 | Hamada et al. |
| 2009/0039770 A1 | 2/2009 | Kang et al. |
| 2013/0264551 A1 | 10/2013 | Pieh et al. |

OTHER PUBLICATIONS

Extended European Search Report dated Apr. 12, 2016, for the corresponding European Patent Application No. 15182896.9.

*Primary Examiner* — Andrew K Bohaty
(74) *Attorney, Agent, or Firm* — Morgan, Lewis & Bockius LLP

(57) ABSTRACT

An organic light emitting display device is disclosed. The organic light emitting device includes a first light emitting part between an anode and a cathode, the first light emitting layer having a hole injection layer, a first hole transport layer, and a first light emitting layer; a second light emitting part over the first light emitting part, the second light emitting part having a second hole transport layer and a second light emitting layer; and a first charge generation layer between the first light emitting part and the second light emitting part, the first charge generation layer having a P-type charge generation layer, wherein at least one among the hole injection layer, the first hole transport layer, the second hole transport layer, and the P-type charge generation layer includes a carbonitrile compound.

8 Claims, 4 Drawing Sheets

ORGANIC LIGHT EMITTING DISPLAY DEVICE

This application claims the priority benefit of Korean Patent Application No. 10-2014-0167746 filed on Nov. 27, 2014, which is incorporated herein by reference for all purposes as if fully set forth herein.

BACKGROUND

Field of the Invention

The present invention relates to an organic light emitting display device, and more particularly, to an organic light emitting display device which is capable of improving its operating voltage.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc is actively under way.

Among these types of panel displays, the OLED devices are a type of devices that, when a charge is injected into an organic light emitting layer formed between an anode and a cathode, emit light as electron-hole pairs are produced and extinguished. The OLED devices are advantageous in that they can be formed on a flexible transparent substrate such as plastic, can be driven at relatively low voltage, less power consumption, and excellent color sense, as compared to plasma display panels or inorganic EL displays. Especially, white OLED devices are used for various purposes in lighting, thin light sources, backlights for liquid crystal displays, or full-color displays employing color filters.

An organic light emitting display device is a lamination structure of an anode, a hole injection layer, a hole transport layer, an a light emitting layer, an electron transport layer, an electron injection layer, and a cathode, and uses the hole injection layer and the electron injection layer to facilitate charge injection. A p-type hole injection layer, which is a type of hole injection layer, is involved in the generation, injection, and transport of holes, and is a layer formed of a single material or includes a matrix material to which a p-type dopant is added. A p-type hole injection layer having a strong electron-attracting substituent forms a hole transport path by accepting electrons from the HOMO (highest occupied molecular orbital) energy level of a matrix material, neighboring hole injection layer, or hole transport layer to the LUMO (lowest unoccupied molecular orbital) energy level of the p-type hole injection layer. After all, the LUMO of the p-type hole injection layer and the HOMO of the neighboring hole transport layer or the matrix material must have similar energy levels to enable efficient hole generation, so p-type hole injecting materials having a strong electron-attracting substituent are needed.

However, the p-type hole injecting materials are not easy to synthesize due to their strong electron-attracting substituent, and have problems with thermal stability and deposition stability. Especially, $F_4$-TCNQ, one of the p-type hole injecting materials, sublimes easily so that this affects the contamination of deposition sources, and devices' performance reproducibility and thermal stability in the manufacture of devices. Moreover, it is not easy to develop p-type hole injecting materials whose LUMO is similar in energy level to the HOMO of a matrix or the HOMO of a hole transport layer and that do not absorb light in a visible light range. In order that the LUMO of a p-type hole injecting material has a similar energy level to the HOMO of a matrix material or neighboring hole transport layer, it is necessary to introduce a strong electron-attracting substituent into the p-type hole injecting material. However, the stronger the electron-attracting substituent is, the harder it is to improve the purity of the material, making the synthesis of the material difficult. Besides, there is a problem that electrons are not moved to the light emitting layer by the strong electron-attracting substituent.

SUMMARY

Accordingly, the present invention is directed to an organic light emitting display device that substantially obviates one or more of the problems due to limitations and disadvantages of the related art.

An object of the present invention is to provide an organic light emitting display device which is capable of improving the operating voltage of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an exemplary embodiment of the present invention provides an indene carbonitrile compound represented by the following Chemical Formula 1:

[Chemical Formula 1]

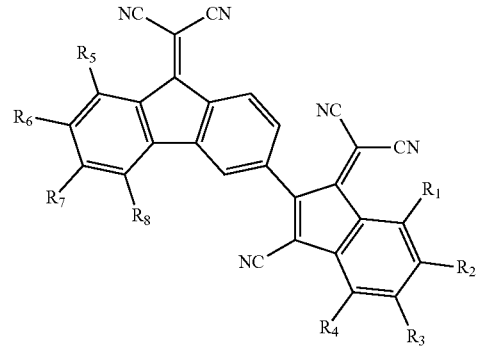

where $R_1$ to $R_8$ independently are one among hydrogen, an alkyl group having 1 to 4 carbon atoms, an alkoxy group, a cyano group, a trifluoromethyl group, a trifluoromethoxy group, a halogen group, a trimethylsilyl group, a pentafluorophenyl group, a pyridyl group, and a tetrafluoropyridyl group, and at least one among $R_5$ to $R_8$ is one among a fluoro group, a cyano group, a trifluoromethyl group, and a trifluoromethoxy group.

In one or more embodiments, the indene carbonitrile compound includes one among the following compounds:

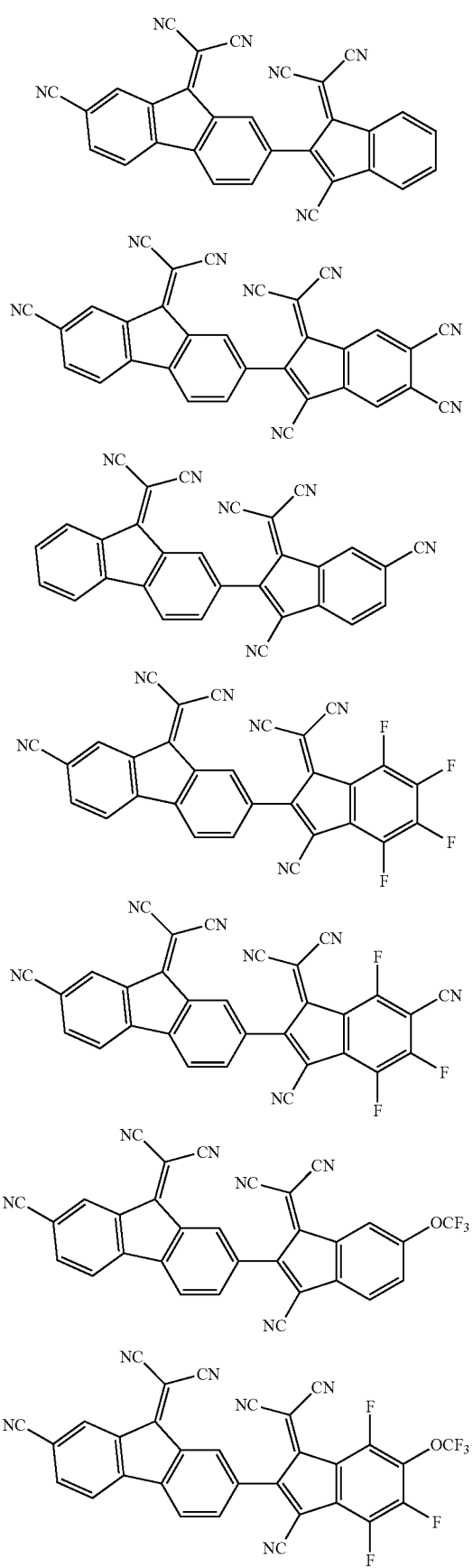
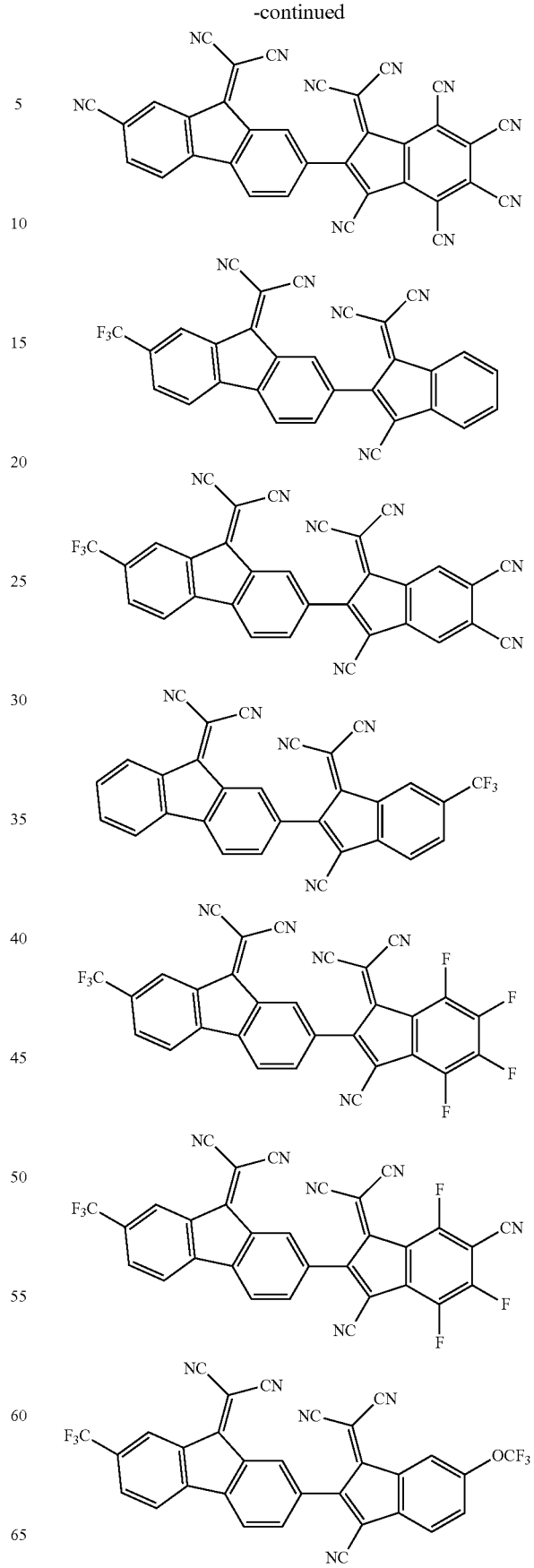

-continued
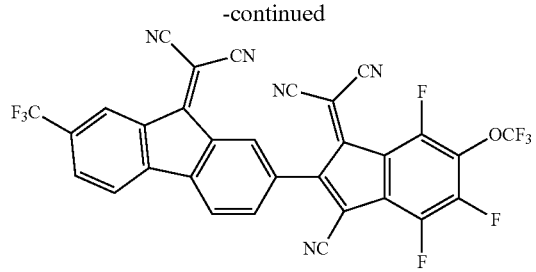
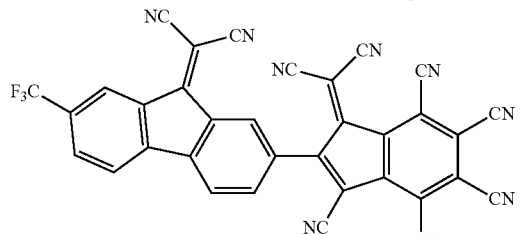
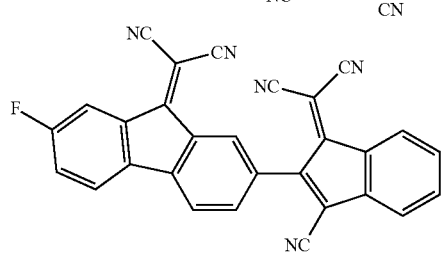
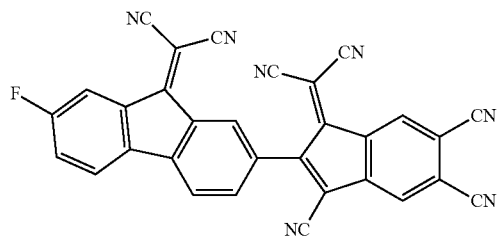
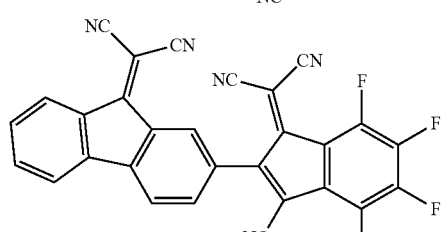
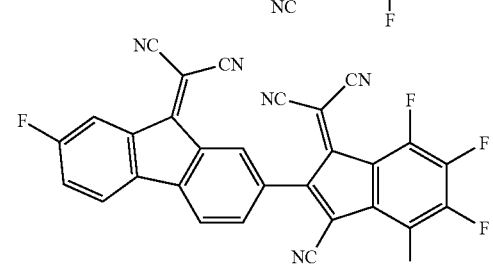
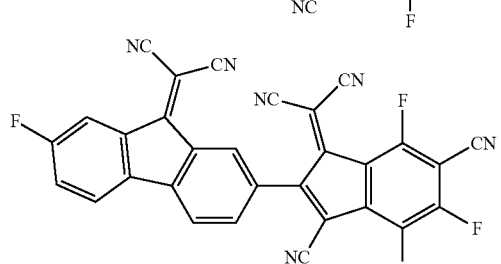
-continued
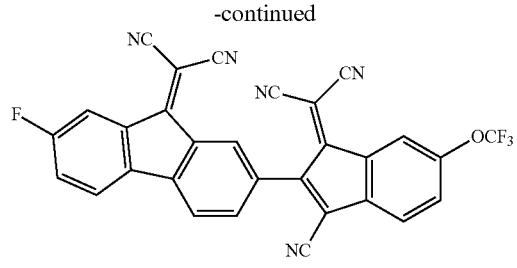
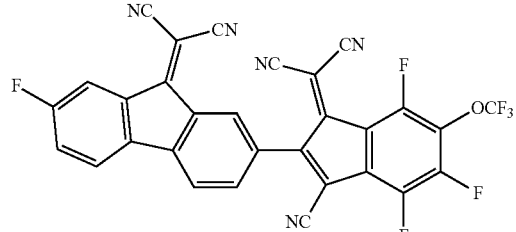
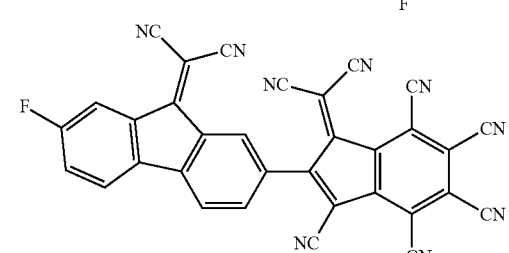
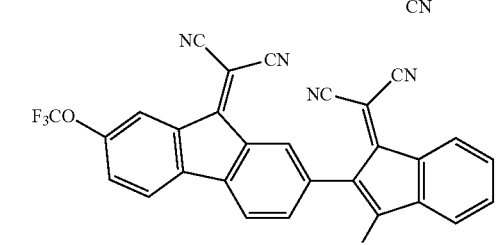
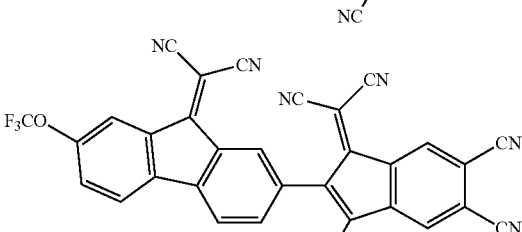
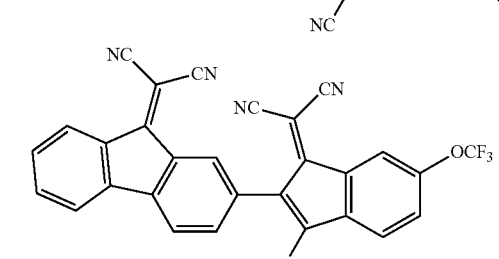
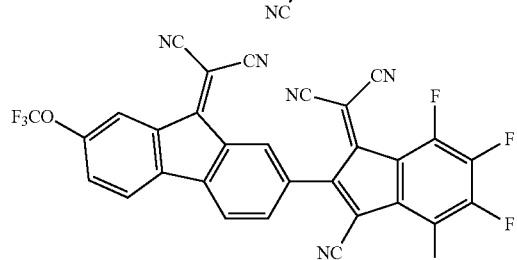

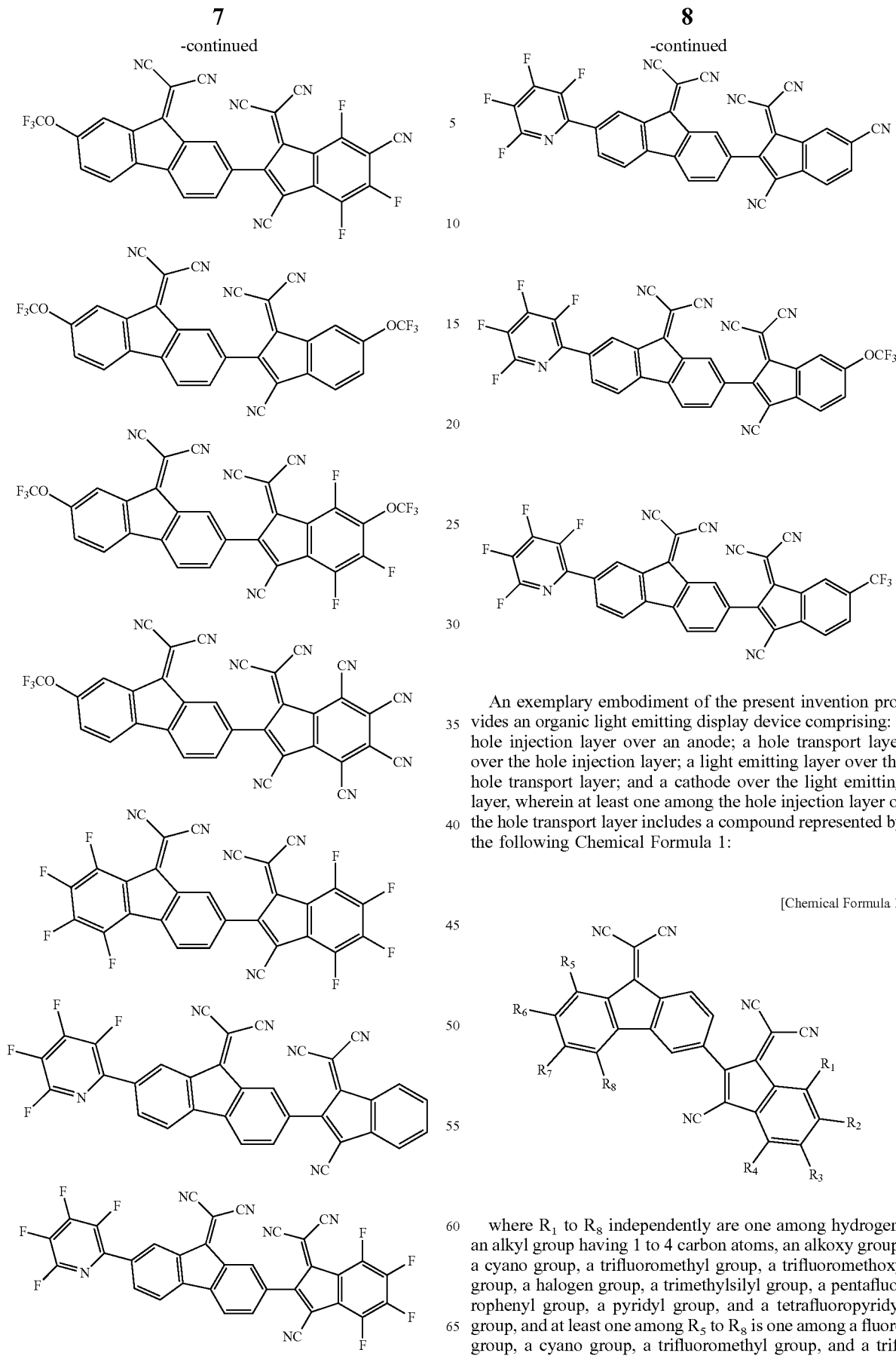

An exemplary embodiment of the present invention provides an organic light emitting display device comprising: a hole injection layer over an anode; a hole transport layer over the hole injection layer; a light emitting layer over the hole transport layer; and a cathode over the light emitting layer, wherein at least one among the hole injection layer or the hole transport layer includes a compound represented by the following Chemical Formula 1:

[Chemical Formula 1]

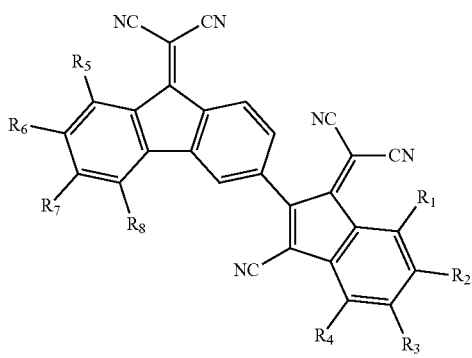

where $R_1$ to $R_8$ independently are one among hydrogen, an alkyl group having 1 to 4 carbon atoms, an alkoxy group, a cyano group, a trifluoromethyl group, a trifluoromethoxy group, a halogen group, a trimethylsilyl group, a pentafluorophenyl group, a pyridyl group, and a tetrafluoropyridyl group, and at least one among $R_5$ to $R_8$ is one among a fluoro group, a cyano group, a trifluoromethyl group, and a trifluoromethoxy group.

In one or more embodiments, the compound includes one among the following compounds:
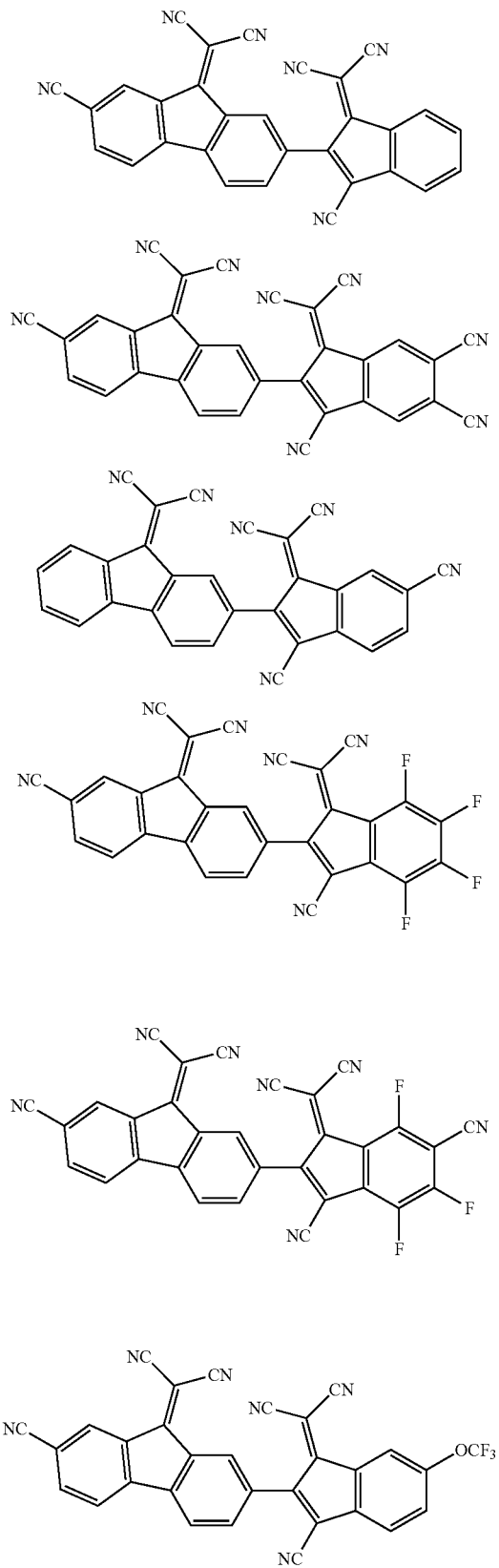
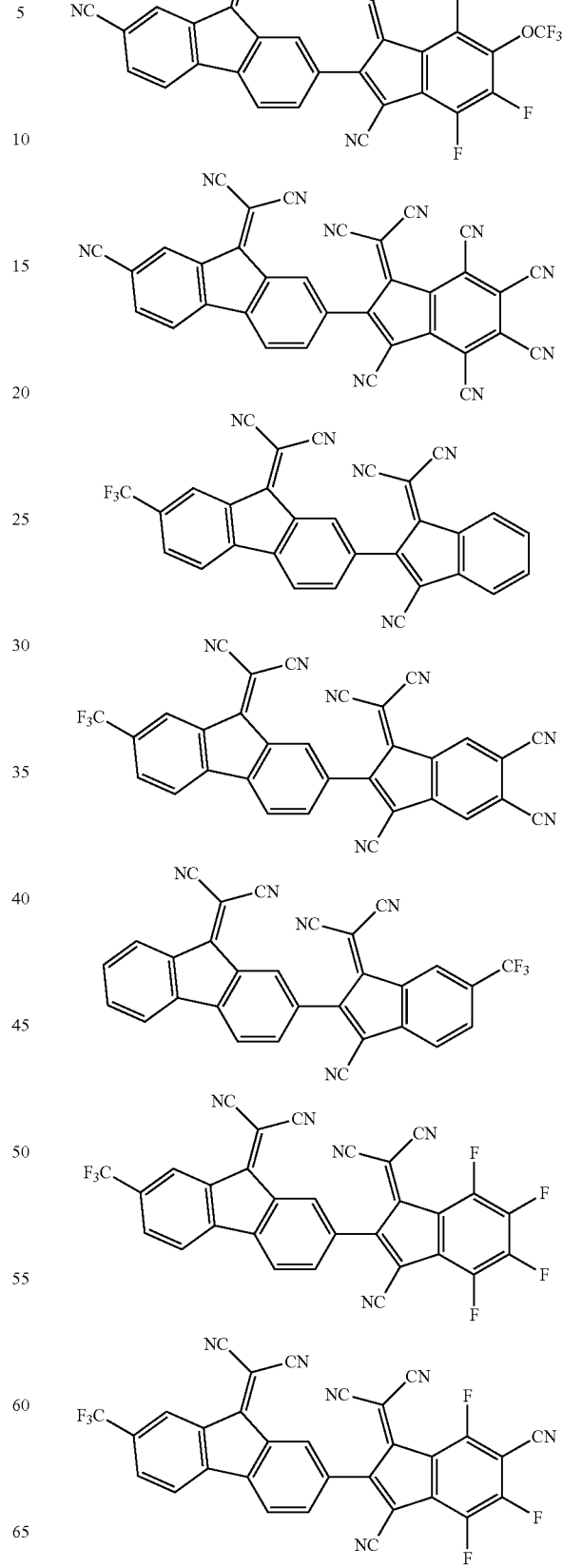

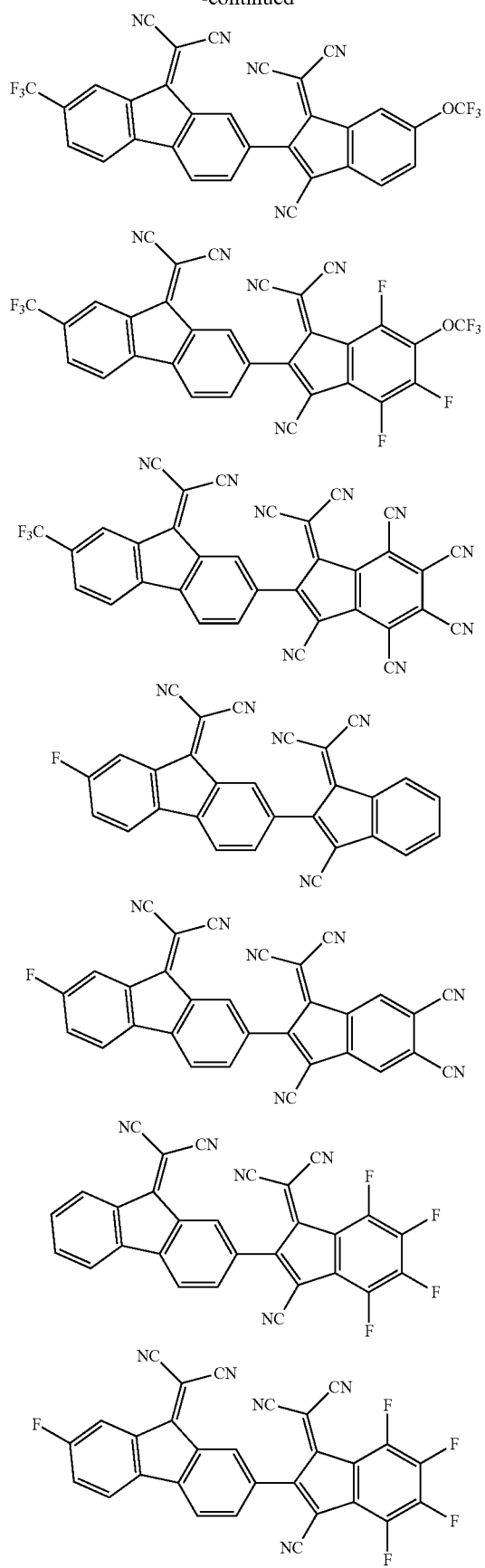
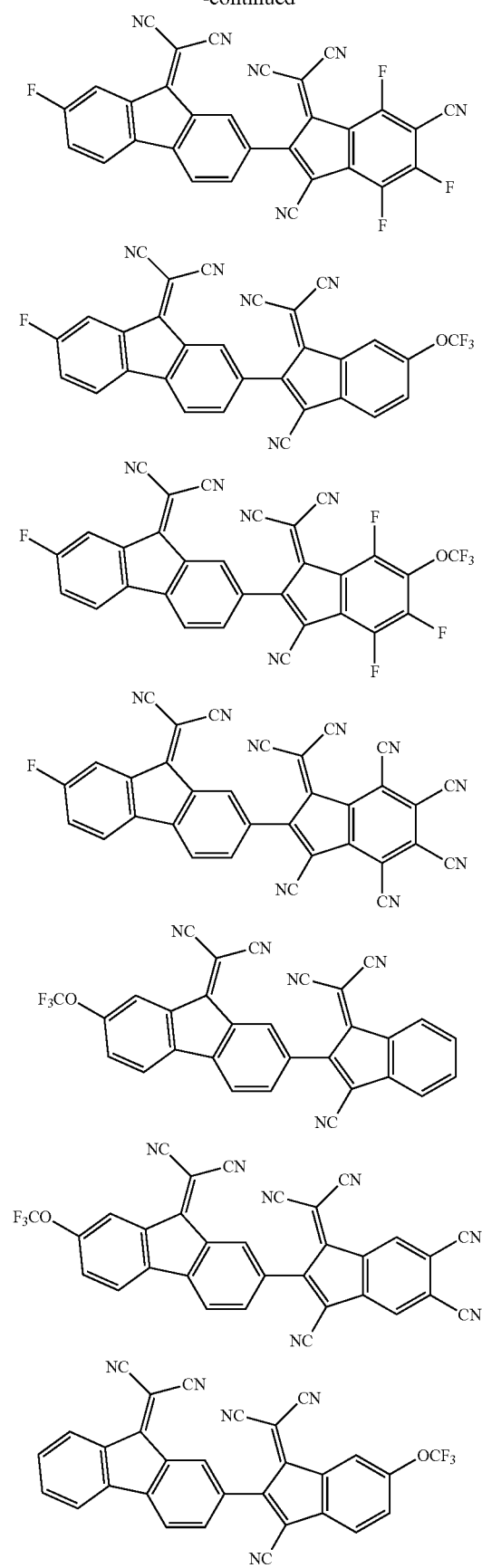

-continued

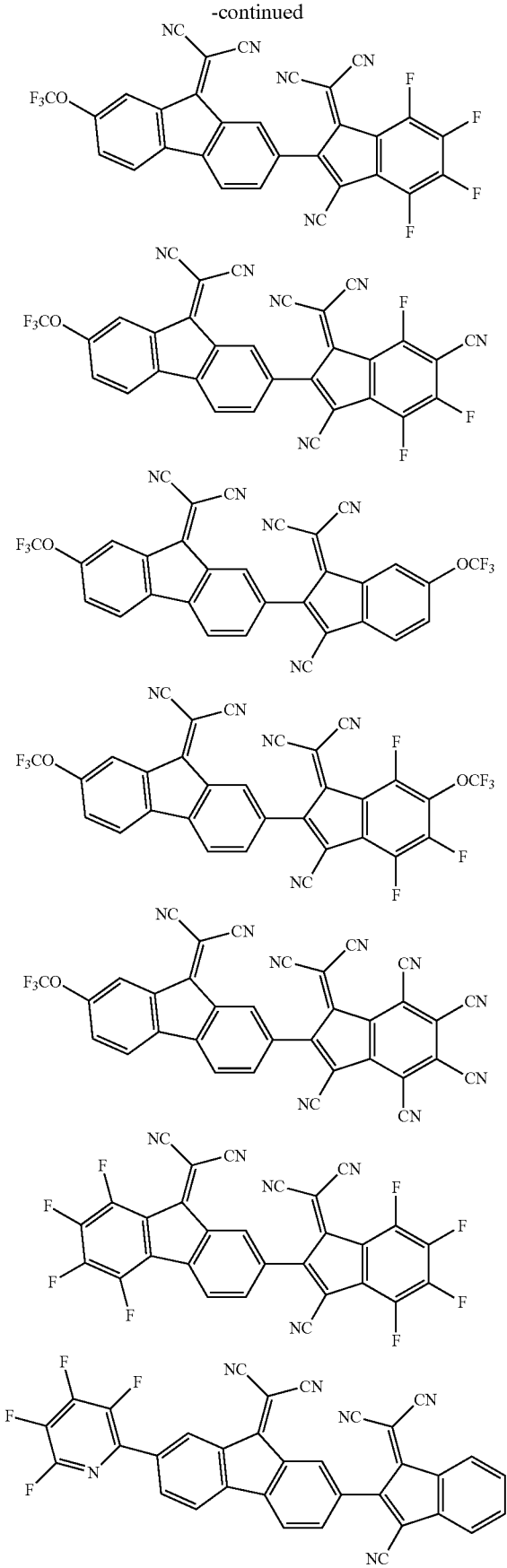
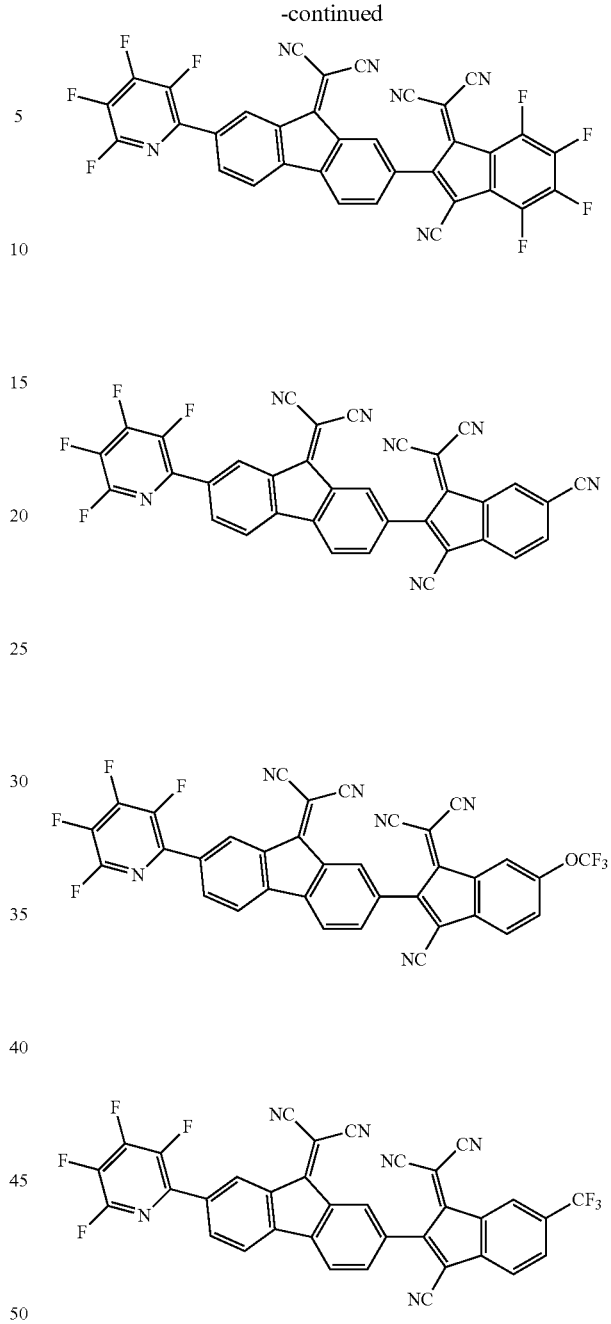

An exemplary embodiment of the present invention provides an organic light emitting display device comprising: a first light emitting part between an anode and a cathode, the first light emitting part having a hole injection layer, a first hole transport layer, and a first light emitting layer; a second light emitting part over the first light emitting part, the second light emitting part having a second hole transport layer and a second light emitting layer; and a first charge generation layer between the first light emitting part and the second light emitting part, the first charge generation layer having a P-type charge generation layer, wherein at least one among the hole injection layer, the first hole transport layer, the second hole transport layer, and the P-type charge generation layer includes a compound represented by the following Chemical Formula 1:

[Chemical Formula 1]

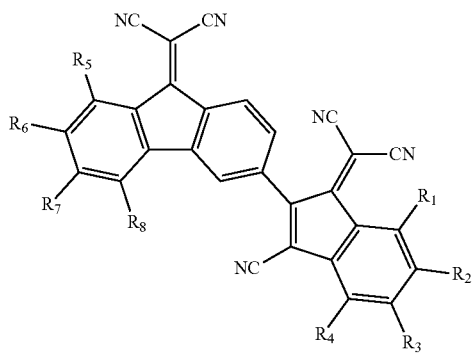

where $R_1$ to $R_8$ independently are one among hydrogen, an alkyl group having 1 to 4 carbon atoms, an alkoxy group, a cyano group, a trifluoromethyl group, a trifluoromethoxy group, a halogen group, a trimethylsilyl group, a pentafluorophenyl group, a pyridyl group, and a tetrafluoropyridyl group, and at least one among $R_5$ to $R_8$ is one among a fluoro group, a cyano group, a trifluoromethyl group, and a trifluoromethoxy group.

In one or more embodiments, the compound includes one among the following compounds:

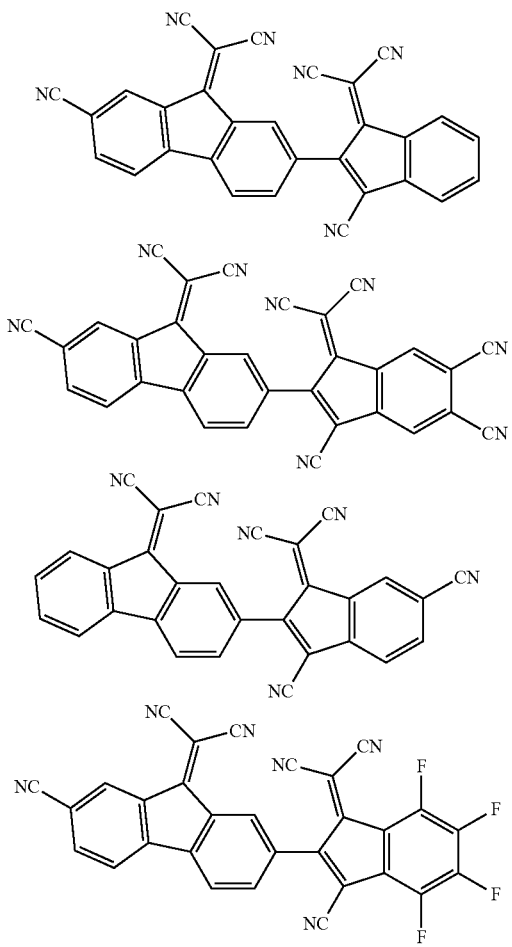

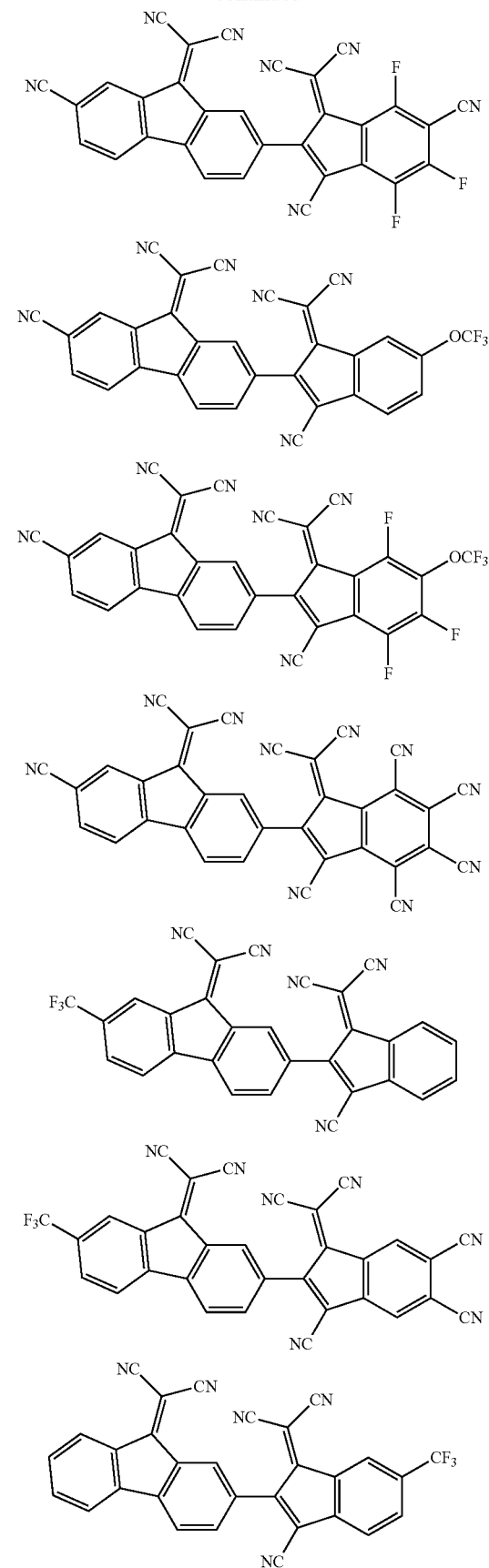

17
-continued
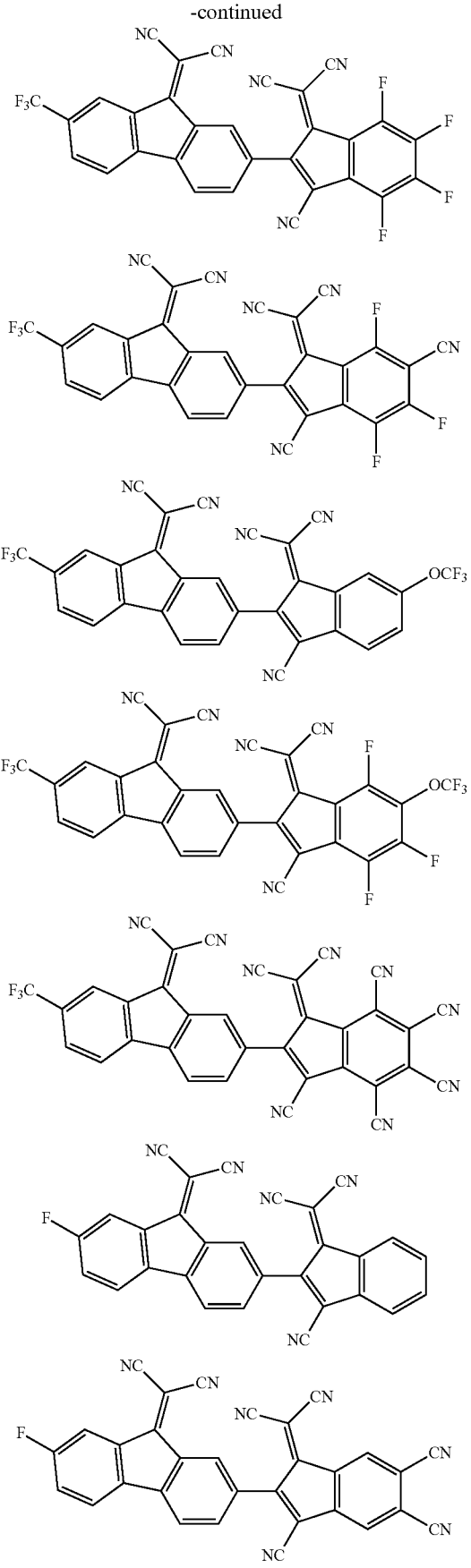
18
-continued
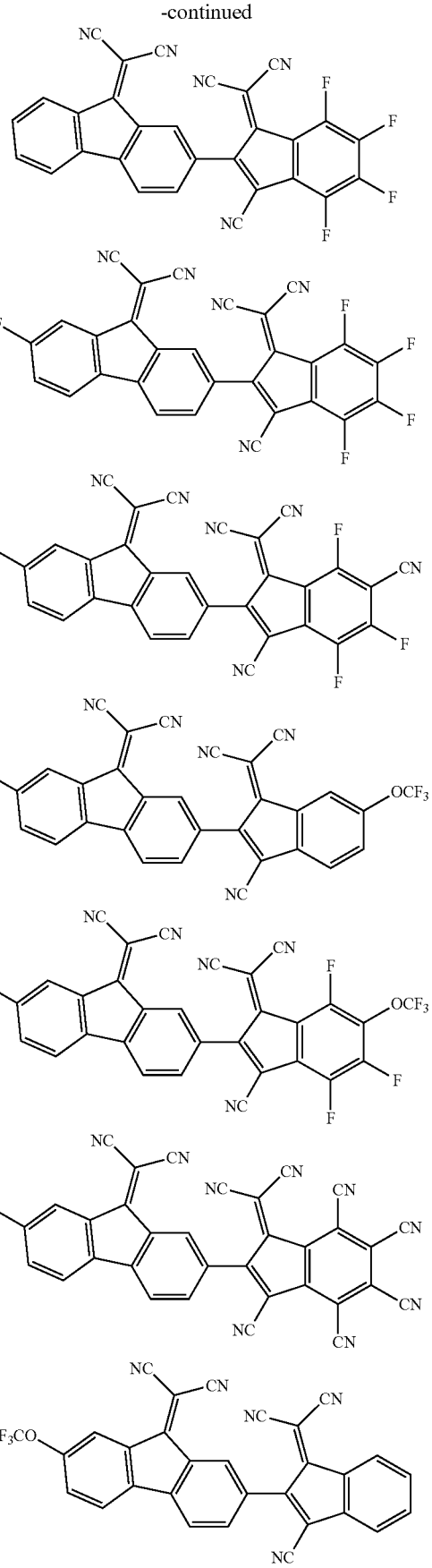

-continued

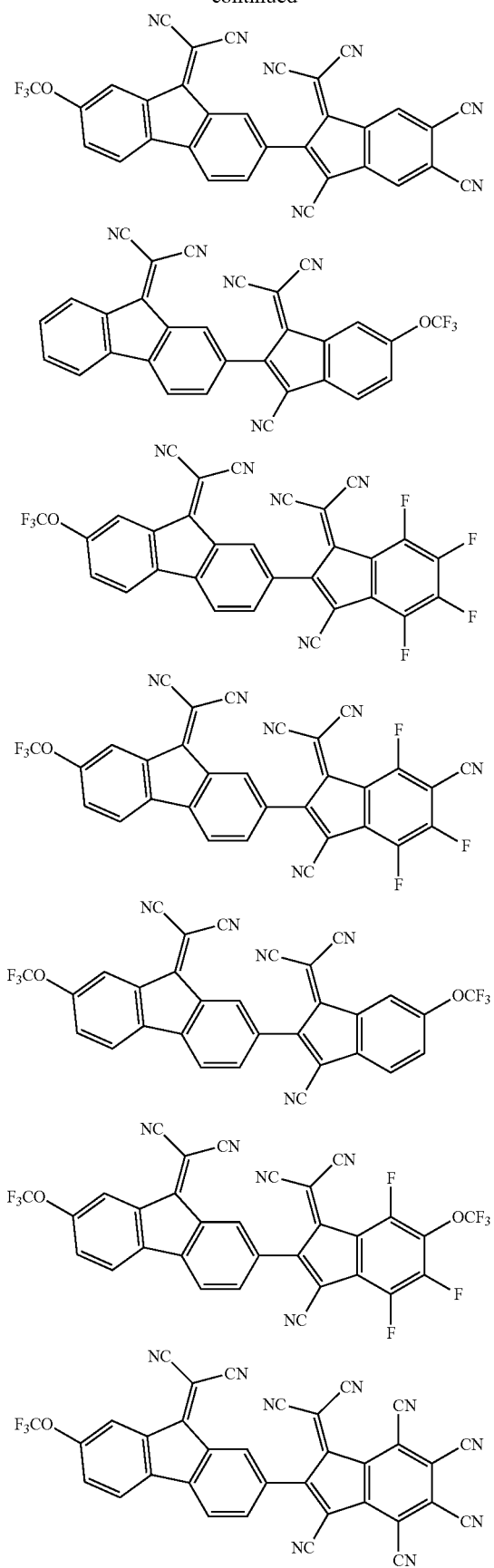

-continued

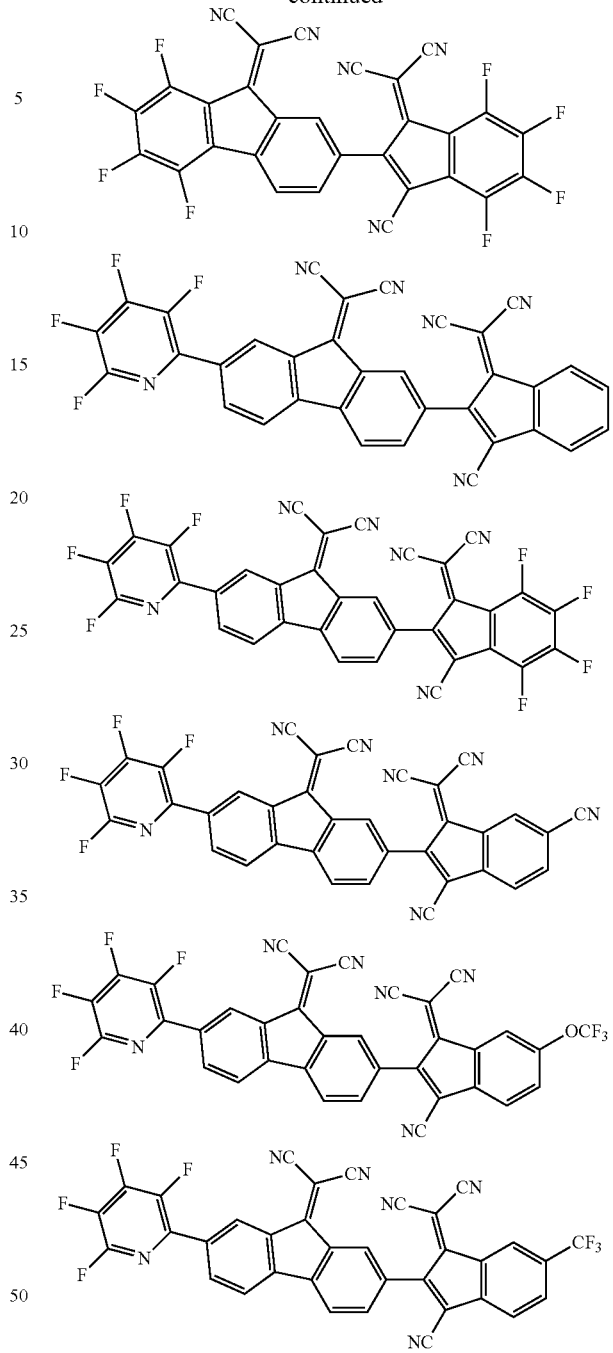

In one or more embodiments, the organic light emitting display device further comprises: a third light emitting part over the second light emitting part, the third light emitting part having a third hole transport layer and a third light emitting layer; and a second charge generation layer between the second light emitting part and the third light emitting part, the second charge generation layer having a P-type charge generation layer, wherein at least one among the third hole transport layer and the P-type charge generation layer of the second charge generation layer includes the compound.

An exemplary embodiment of the present invention provides an organic light emitting display device comprising: an organic layer over an anode; and a cathode over the organic layer, wherein the organic layer includes a carbonitrile compound having an electron-attracting substituent so that a LUMO of the organic layer has a similar energy level to a HOMO of the organic layer.

In one or more embodiments, the electron-attracting substituent includes indene carbonitrile compound.

In one or more embodiments, the carbonitrile compound includes an indene carbonitrile compound.

In one or more embodiments, the organic layer includes one among a hole injection layer, a hole transport layer, or a P-type charge generation layer.

In one or more embodiments, if the organic layer is a hole injection layer, the compound in the hole injection layer allows a hole transport path between the hole injection layer and a hole transport layer adjacent to the hole injection layer, because the compound has the LUMO energy level similar to the HOMO energy level of the hole transport layer.

In one or more embodiments, if the organic layer includes at least one among a hole injection layer, a hole transport layer, and a P-type hole injection layer, the at least one among the hole injection layer, the hole transport layer, and the P-type hole injection layer has a host and a dopant having the compound, and the dopant allows a hole transport path within the at least one among the hole injection layer, the hole transport layer, and the P-type charge generation layer, because the dopant has the LUMO energy level similar to the HOMO energy level of the host.

In one or more embodiments, the organic light emitting display device having the compound has reduced operating voltage compared to an organic light emitting display device without the compound.

In one or more embodiments, the organic layer includes at least one among a hole injection layer, a hole transport layer, an electron blocking layer, a hole blocking layer, an electron transport layer, an N-type charge generation layer, and a P-type charge generation layer, and the at least one among the hole injection layer, the hole transport layer, and the P-type charge generation layer includes the compound.

In one or more embodiments, the compound includes a compound represented by the following Chemical Formula 1:

[Chemical Formula 1]

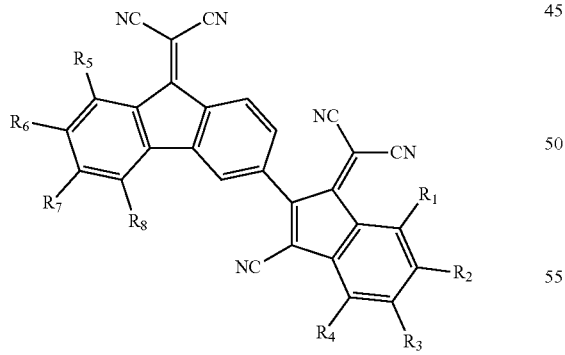

where $R_1$ to $R_8$ independently are one among hydrogen, an alkyl group having 1 to 4 carbon atoms, an alkoxy group, a cyano group, a trifluoromethyl group, a trifluoromethoxy group, a halogen group, a trimethylsilyl group, a pentafluorophenyl group, a pyridyl group, and a tetrafluoropyridyl group, and at least one among $R_5$ to $R_8$ is one among a fluoro group, a cyano group, a trifluoromethyl group, and a trifluoromethoxy group.

In one or more embodiments, the compound includes one among the following compounds:

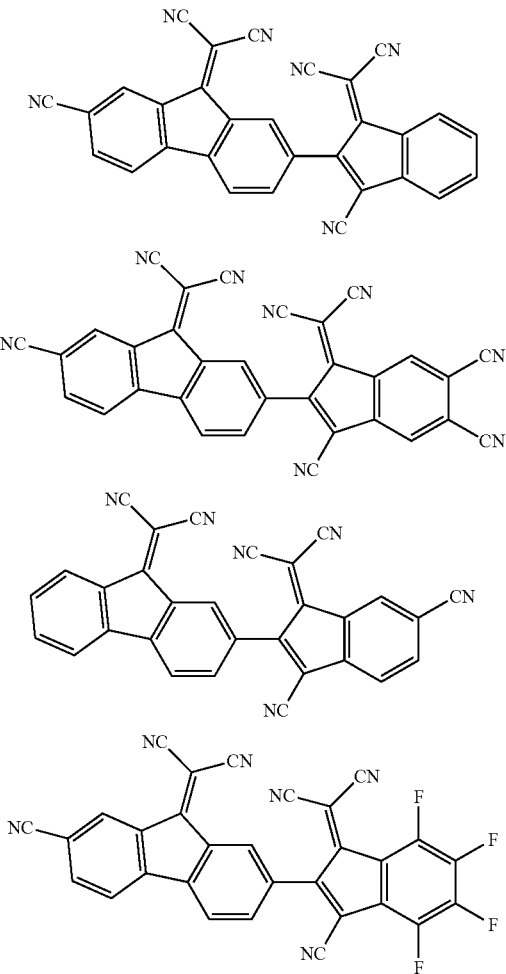

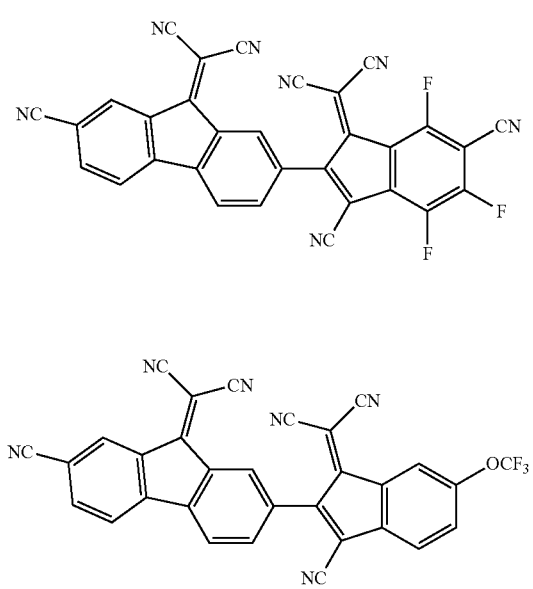

23
-continued
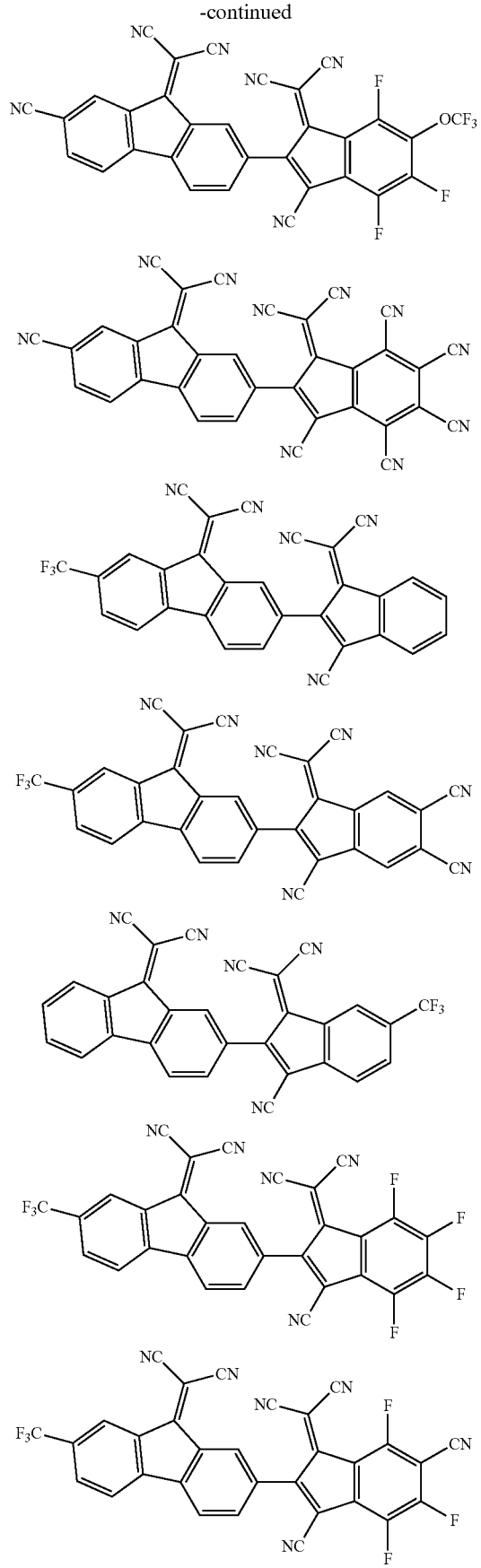
24
-continued
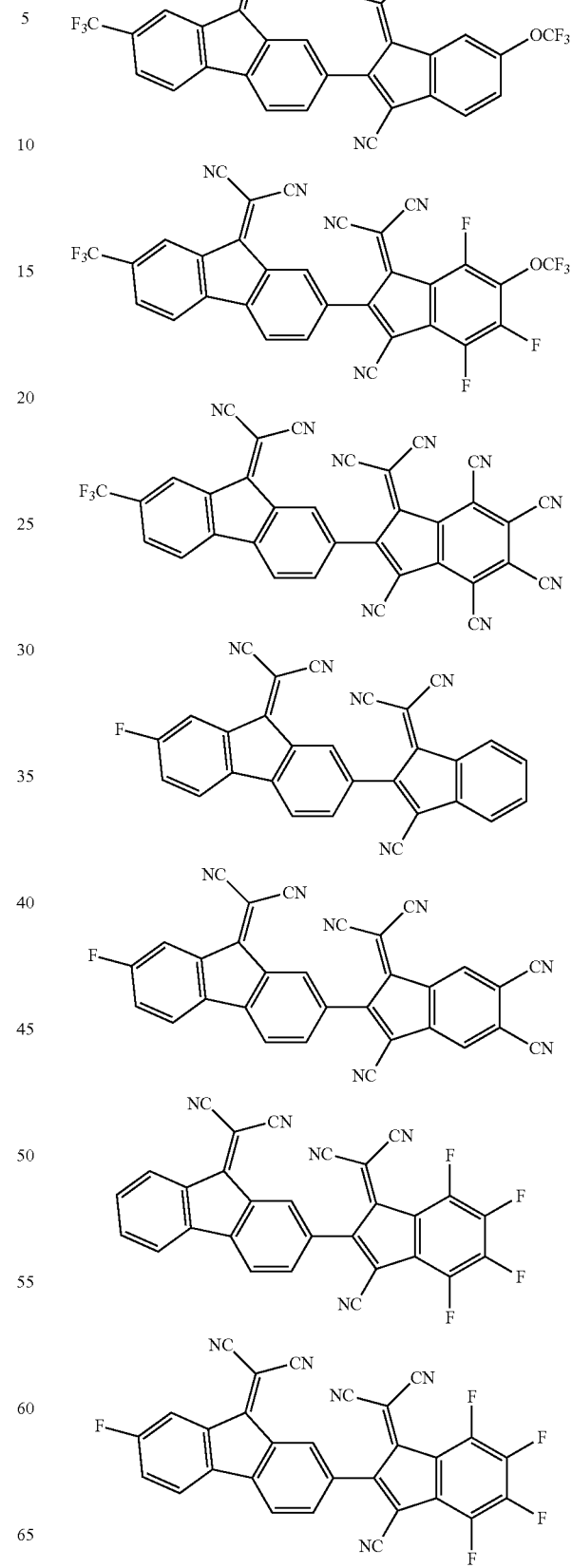

25
-continued
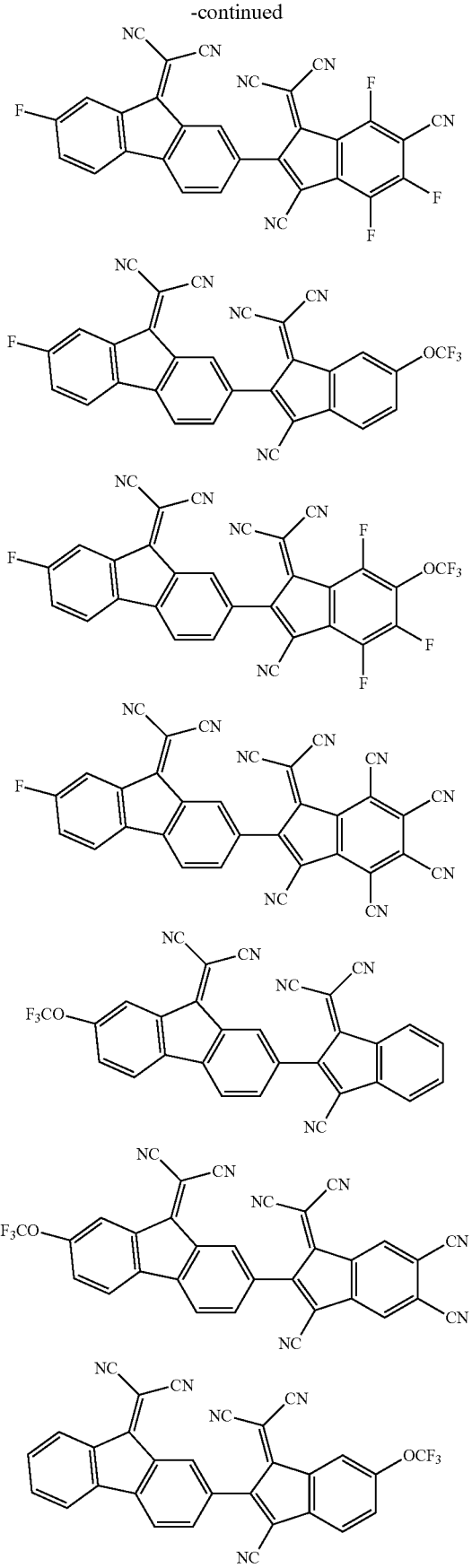
26
-continued
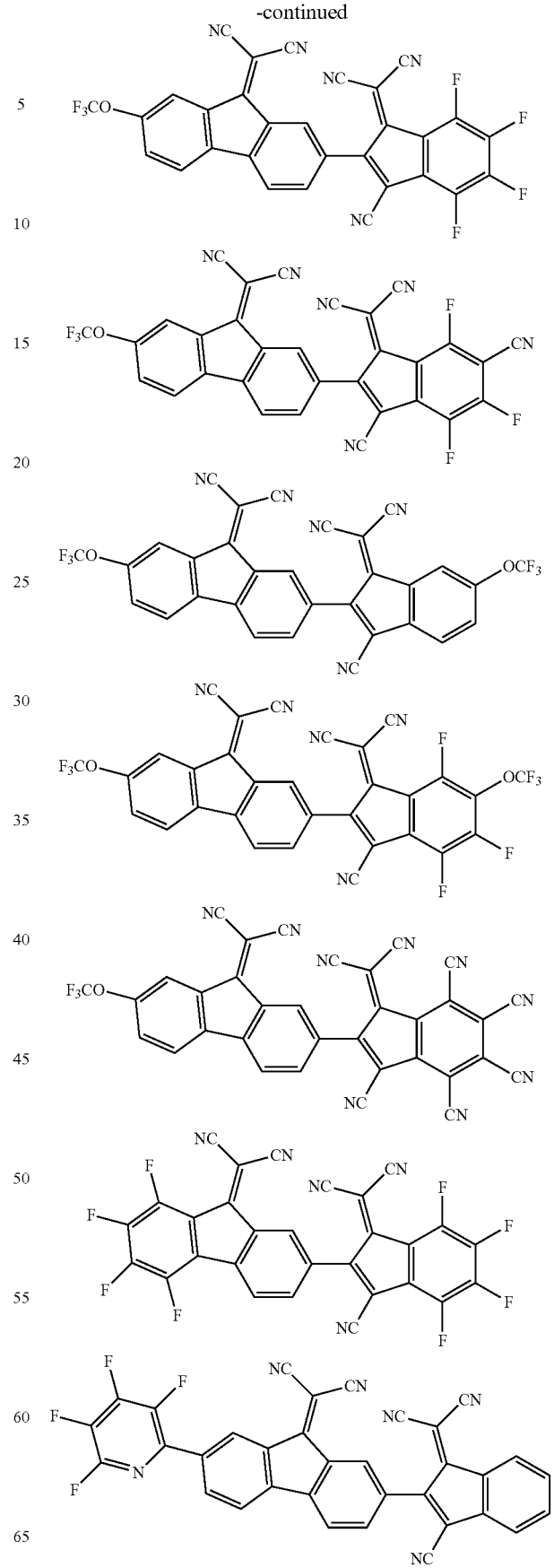

-continued

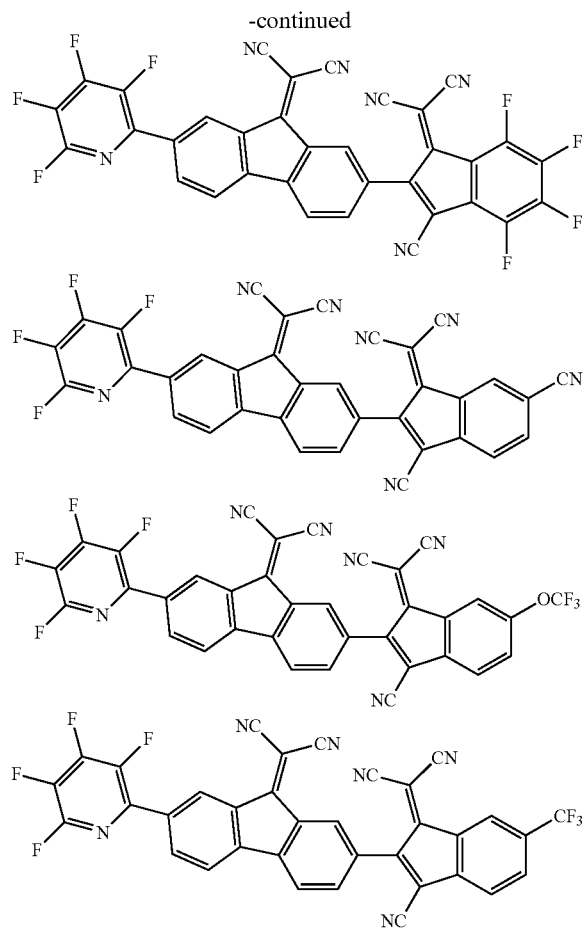

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
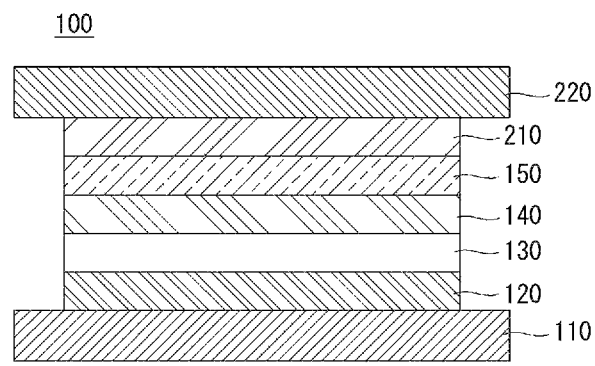
FIG. 1 is a cross-sectional view showing an organic light emitting display device according to a first exemplary embodiment of the present invention.

The advantages and features of the present invention and methods for accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims The shapes, sizes, percentages, angles, numbers, etc shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another either partly or wholly, and may technically interact or work together in various ways. The exemplary embodiments may be carried out independently or in combination with one another.

Hereinafter, various exemplary embodiments of the present invention will be described in detail with reference to the accompanying drawings.

FIG. 1 is a cross-sectional view showing an organic light emitting display device according to a first exemplary embodiment of the present invention.

Referring to FIG. 1, an organic light emitting display device 100 according to the first exemplary embodiment of the present invention comprises an anode 110, a hole injection layer 120, a hole transport layer 130, an light emitting layer 140, an electron transport layer 150, an electron injection layer 210, and a cathode 220. The hole injection layer 120, the hole transport layer 130, the light emitting layer 140, the electron transport layer 150, and the electron injection layer 210 may be organic layers. The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further include a reflective layer formed of one among aluminum (Al), silver (Ag), or nickel (Ni) under a layer formed of one among ITO, IZO, or ZnO.

The hole injection layer 120 functions to facilitate hole injection from the anode 110 into the light emitting layer 140, and affects the operating voltage of the organic light emitting display device. In view of this, the present inventors conducted various tests of experiments to improve the hole injection properties of the hole injection layer. Through a number of tests or experiments which were performed on materials that do not affect the lifetime or efficiency of organic light emitting display devices, an indene carbonitrile compound was introduced into the hole injection layer. The indene carbonitrile compound facilitates hole injection from the anode into the light emitting layer by lowering the LUMO energy level by applying an indeno carbonitrile substituent having a strong electron-attracting property. Accordingly, by using an indene carbonitrile compound for a hole injection layer, holes can be smoothly transferred from the anode to the light emitting layer, thereby increasing luminous efficiency and reducing operating voltage. Also, if the hole injection layer includes a carbonitrile compound having an electron-attracting substituent so that the LUMO of the hole injection layer has a similar energy level to the HOMO of the hole injection layer or a hole transport layer adjacent to the hole injection layer, this helps the transfer of holes from the anode to the light emitting layer, thereby increasing luminous efficiency and reducing operating voltage. The electron-attracting substituent may include indene carbonitrile compound. The carbonitrile compound may include an indene carbonitrile compound.

Accordingly, the hole injection layer 120 is formed of an indene carbonitrile compound represented by the following Chemical Formula 1:

[Chemical Formula 1]

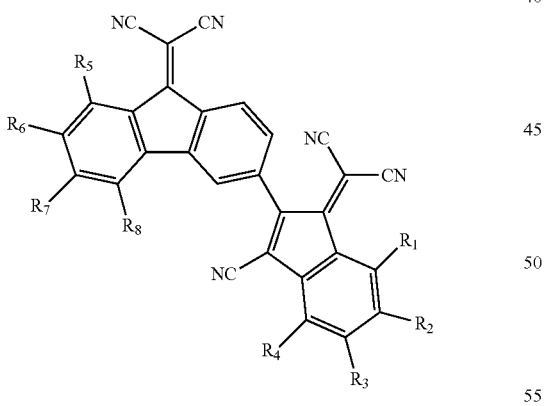

where $R_1$ to $R_8$ independently are one among hydrogen, an alkyl group having 1 to 4 carbon atoms, an alkoxy group, a cyano group, a trifluoromethyl group, a trifluoromethoxy group, a halogen group, a trimethylsilyl group, a pentafluorophenyl group, a pyridyl group, and a tetrafluoropyridyl group, and at least one among $R_5$ to $R_8$ is one among a fluoro group, a cyano group, a trifluoromethyl group, and a trifluoromethoxy group.

The indene carbonitrile compound includes one among the following compounds:

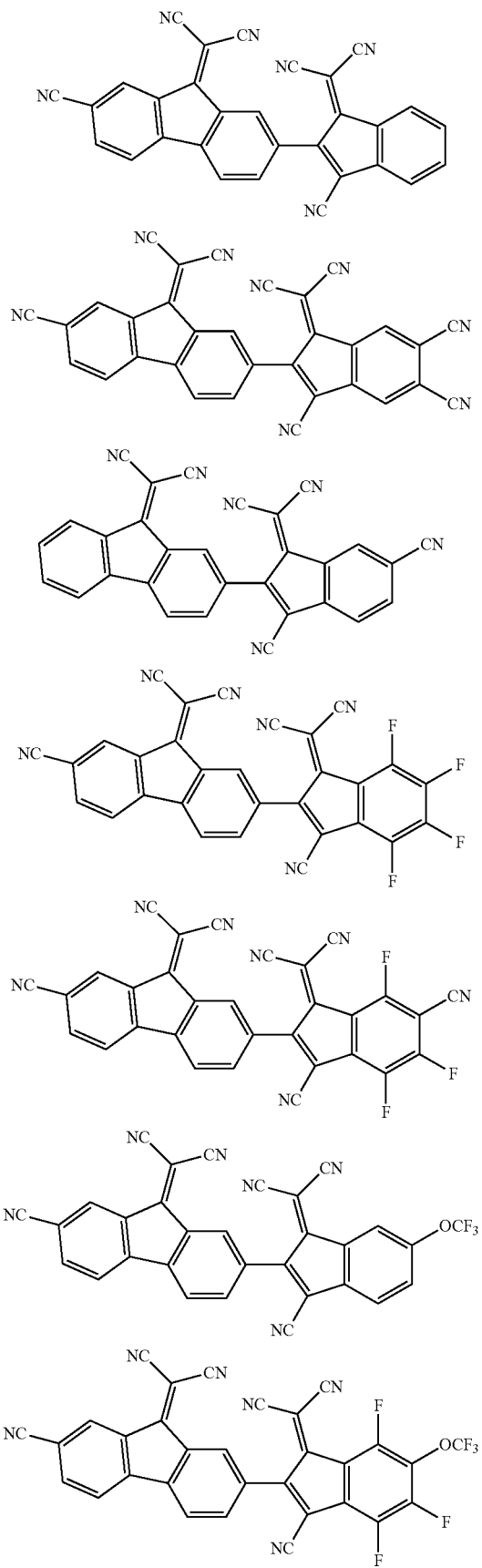

31
-continued
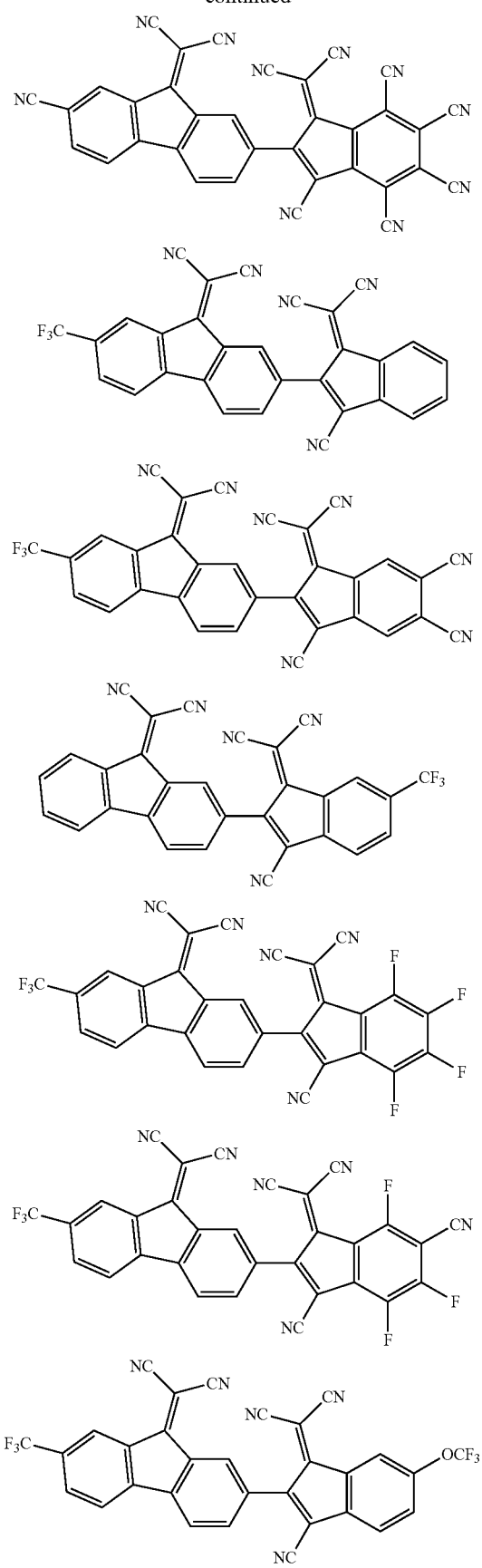
32
-continued
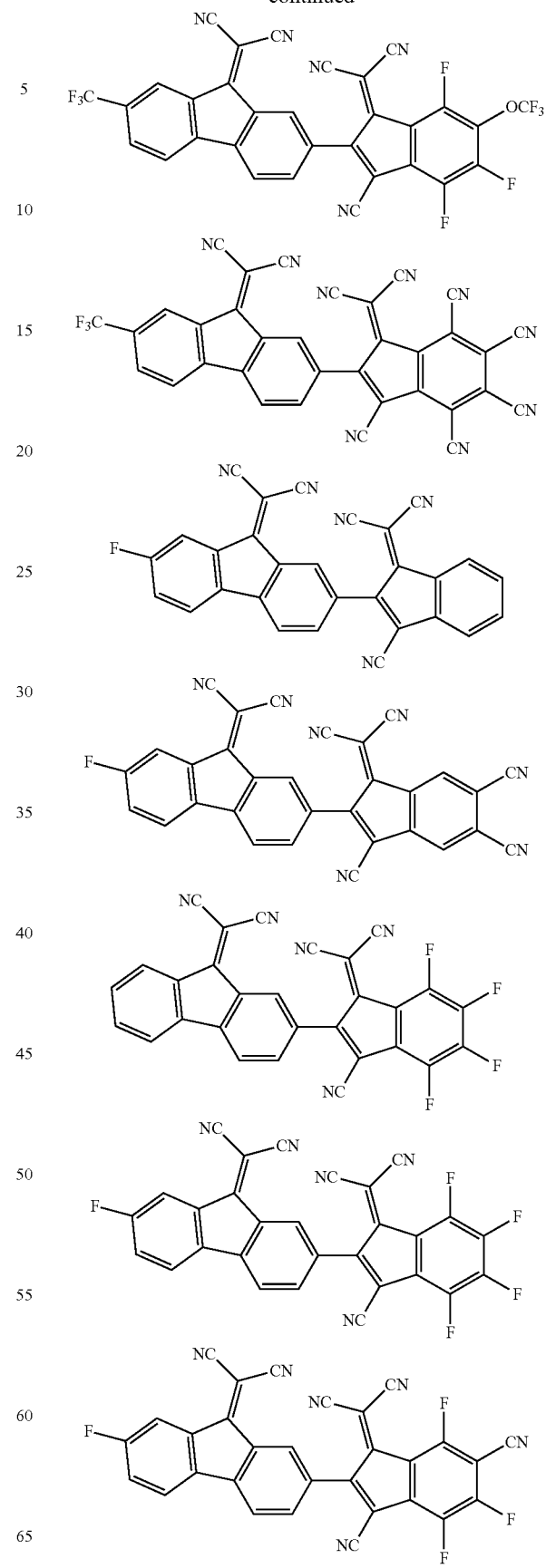

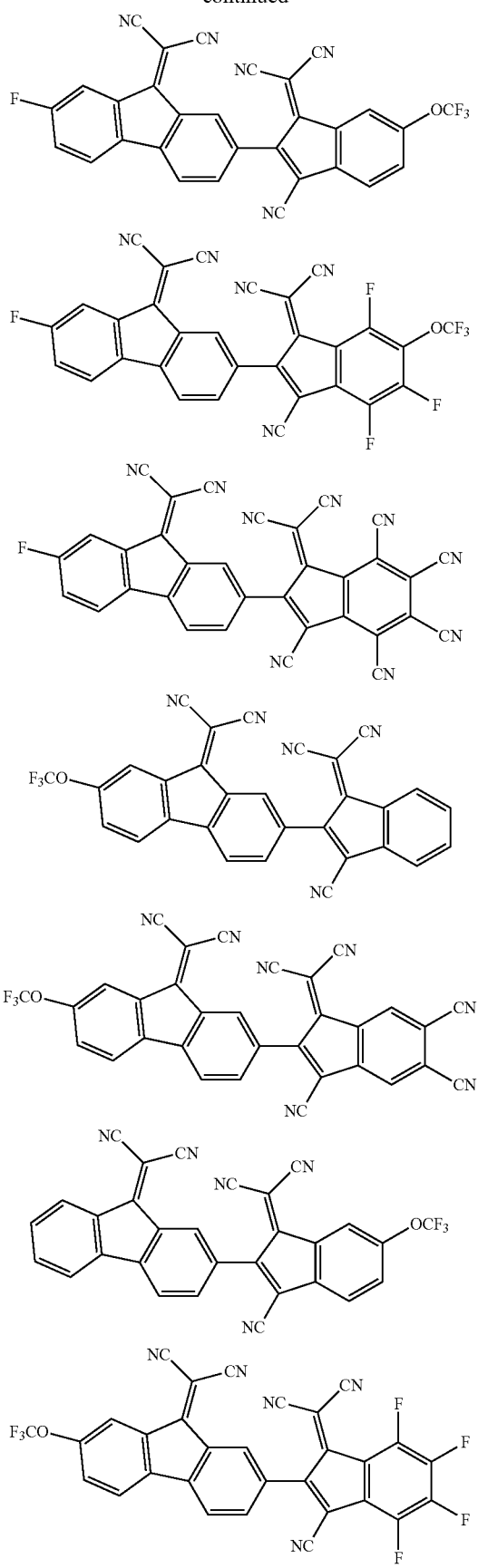
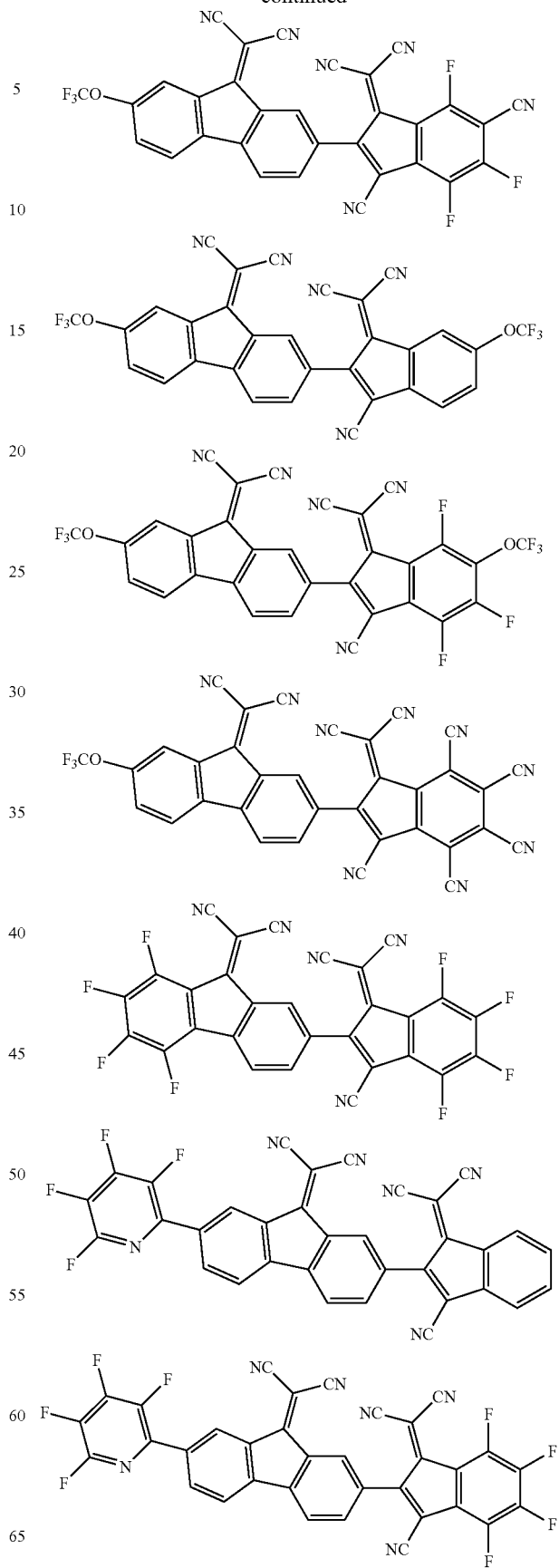

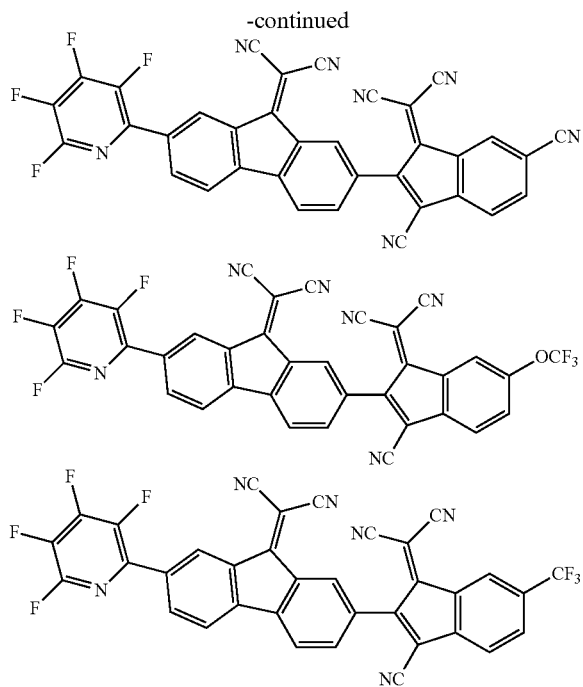

The hole injection layer 120 may include an indene carbonitrile compound of the present invention, or may include an indene carbonitrile compound as a dopant. If the hole injection layer 120 includes an indene carbonitrile compound, the hole injection layer 120 includes solely of the indene carbonitrile compound. Also, if the hole injection layer 120 includes an indene carbonitrile compound as a dopant, the hole injection layer 120 may include one or more among CuPc(copper phthalocyanine), PEDOT(poly(3,4)-ethylenedioxythiophene), PANI(polyaniline), and NPD(N,N-bis(naphthalene-1-yl)-N,N'-bis(Phenyl)-2,2-dimethylbenzidine) and a dopant having the indene carbonitrile compound.

The hole injection layer 120 may be 1 to 150 nm thickness. If the hole injection layer 120 is 1 nm thickness or greater, the hole injection properties may be improved, or if the hole injection layer 120 is 150 nm thickness or less, an increase in the thickness of the hole injection layer 120 may be prevented and a rise in operating voltage may be therefore prevented.

The hole transport layer 130 functions to facilitate hole transport, and may be formed of, but are not limited to, one or more among NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2,2'7,7'-tetrakis(N,N-diphenylamino)-9,9'-spirofluorene), and MTDATA(4,4',4"-tris(N-3-methylphenyl-N-phenylamino)-triphenylamine). The hole transport layer 130 may be 1 to 150 nm thickness. If the hole transport layer 130 is 1 nm thickness or greater, the hole transport properties may be improved, or if the hole transport layer 130 is 150 nm thickness or less, an increase in the thickness of the hole transport layer 130 may be prevented, and a rise in operating voltage may be therefore prevented.

The light emitting layer 140 may emit light of red(R), green(G), or blue(B), and may be formed of a phosphorescent material or a fluorescent material.

If the light emitting layer 140 is a red light emitting layer, it may be formed of, but are not limited to, a phosphorescent material having a host material such as CBP(4,4'-bis(carbazol-9-yl)biphenyl) and a dopant comprising one or more among Ir(piq)$_2$(acac)bis(1-phenylisoquinoline)(acetylacetonate)iridium(III), Ir(pq)$_2$(acac)bis(1-phenylquinoline)acetylacetonate)iridium(III), Ir(pq)$_3$(tris(1-phenylquinoline)iridium(III), and PtOEP(octaethylporphine platinum(II). If the light emitting layer 140 is a green light emitting layer, it may be formed of, but are not limited to, a phosphorescent material having a host material such as CBP(4,4'-bis(carbazol-9-yl)biphenyl) and a dopant material having an iridium-based material. Alternatively, the green light emitting layer may be formed of, but are not limited to, a fluorescent material having Alq$_3$(tris(8-hydroxyquinolino)aluminum. If the light emitting layer 140 is a blue light emitting layer, it may be formed of, but are not limited to, a phosphorescent material having a host material such as CBP(4,4'-bis(carbazol-9-yl)biphenyl) and a dopant material including an iridium-based material. Alternatively, the blue light emitting layer may be formed of, but are not limited to, a fluorescent material having any one among spiro-DPVBi, spiro-CBP, distyrylbenzene (DSB), distyrylarylene (DSA), a PFO polymer, and a PPV polymer.

The electron transport layer 150 functions to facilitate electron transport, and may be formed of, but not are limited to, one or more among Alq$_3$(tris(8-hydroxyquinolinato)aluminum), PBD(2-(4-biphenyl)-5-(4-tert-butylphenyl)-1,3,4-oxadiazole), TAZ(3-(4-biphenyl)-4-pheynyl-5-tert-butylphenyl-1,2,4-triazole), and BAlq(bis(2-methyl-8-quinolinolate)-4-(phenylphenolato)aluminum). The electron transport layer 150 may be 1 to 150 nm thickness. If the electron transport layer 150 is 1 nm thickness or greater, a degradation of the electron transport properties may be prevented, or if the electron transport layer 150 is 150 nm thickness or less, an increase in the thickness of the electron transport layer 150 may be prevented, and a rise in operating voltage may be therefore prevented.

The electron injection layer 210 is over the electron transport layer 150. The electron injection layer 210 functions to facilitate electron injection, and may be formed of, but are not limited to, Alq$_3$ (tris(8-hydroxyquinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), or BAlq(bis(2-methyl-8-quinolinolate)-4-(phenylphenolato)aluminum). On the other hand, the electron injection layer 210 may be formed of a metal compound, and the metal compound may be, for example, but not limited to, one or more among LiQ, LiF, NaF, KF, RbF, CsF, FrF, BeF$_2$, MgF$_2$, CaF$_2$, SrF$_2$, BaF$_2$, and RaF$_2$. The electron injection layer 210 may be 1 to 50 nm thickness. If the electron injection layer 250 is 1 nm thickness or greater, a degradation of the electron injection properties may be prevented, or if the electron injection layer 210 is 50 nm thickness or less, an increase in the thickness of the electron injection layer 210 may be prevented, and a rise in operating voltage may be therefore prevented.

The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

Although the organic light emitting display device according to the first exemplary embodiment has been illustrated and described with an example where a hole injection layer includes an indene carbonitrile compound, an indene carbonitrile compound of the present invention may be applied for the hole transport layer 130 as well. Also, an indene carbonitrile compound may be applied as a dopant for a hole injection layer or hole transport layer. Moreover, the hole injection layer or hole transport layer has a host and a dopant, and a hole transport path is formed within the hole injection layer or hole transport layer by using a dopant comprising a compound whose LUMO is similar in energy level to the HOMO of the host. This facilitates the transfer of holes to the light emitting layer, thereby reducing the operating voltage.

As discussed above, in the present invention, the LUMO energy level can be lowered by the introduction of an indene carbonitrile compound comprising an indene carbonitrile substituent having a strong electron-attracting property, thereby facilitating hole injection from the anode into the light emitting layer. Accordingly, by using an indene carbonitrile compound for a hole injection layer or hole transport layer, holes can be smoothly transferred from the anode to the light emitting layer, thereby reducing operating voltage. Also, if the hole injection layer 120 includes a carbonitrile compound having an electron-attracting substituent so that the LUMO has a similar energy level to the HOMO, this helps the transfer of holes from the anode to the light emitting layer, thereby increasing luminous efficiency and reducing operating voltage. The electron-attracting substituent may include indene carbonitrile compound. The carbonitrile compound may include an indene carbonitrile compound.

Figure 2:
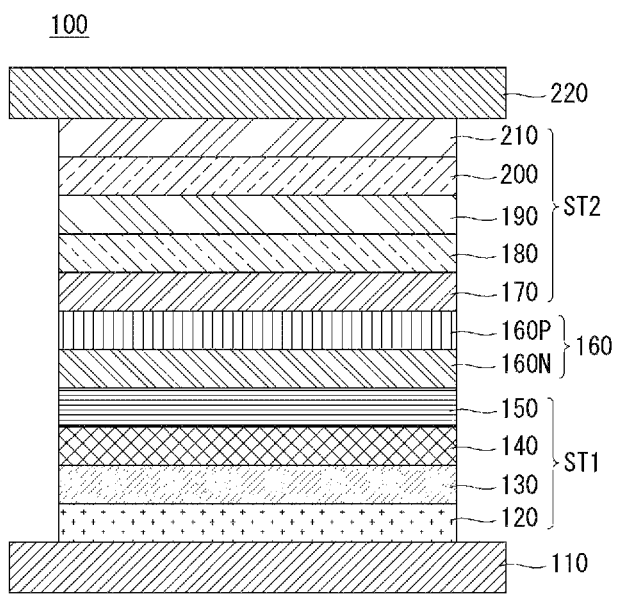
FIG. 2 is a cross-sectional view showing an organic light emitting display device according to a second exemplary embodiment of the present invention.

FIG. 2 is a view showing an organic light emitting display device according to a second exemplary embodiment of the present invention. The same elements as the first exemplary embodiment are denoted by the same reference numerals, so descriptions of these elements will be omitted below.

Referring to FIG. 2, an organic light emitting display device 100 of the present invention comprises a plurality of light emitting parts ST1 and ST2 between an anode 110 and a cathode 220, and a charge generation layer 160 between the light emitting parts ST1 and ST2.

More specifically, the first light emitting part ST1 is a single light emitting diode unit, and includes a first light emitting layer 140. The first light emitting layer 140 may emit light of one among red, green, or blue: for example, it may be a blue light emitting layer in this exemplary embodiment. The first light emitting part ST1 further includes a hole injection layer 120 and a first hole transport layer 130 that are between the anode 110 and the first light emitting layer 140. Also, the first light emitting part ST1 further includes a first electron transport layer 150 over the first light emitting layer 140. Accordingly, the first light emitting part ST1 having the hole injection layer 120, the first hole transport layer 130, the first light emitting layer 140, and the first electron transport layer 150 is formed over the anode 110. The hole injection layer 120 and the first hole transport layer 130 may not be included in the composition of the first light emitting part ST1, depending on the structure or characteristics of the device. The first hole injection layer 120, the first hole transport layer 130, the first light emitting layer 140, and the first electron transport layer 150 may be organic layers.

A charge generation layer (CGL) 160 is over the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the light emitting layer of the second light emitting part ST1 adjacent to the anode, and the P-type charge generation layer 160P supplies holes to the light emitting layer of the second light emitting part ST2. As such, the organic light emitting display device with a plurality of light emitting layers can further increase its luminous efficiency and lower its operating voltage. Accordingly, the charge generation layer 160 has a major effect on the organic light emitting display device's characteristics, i.e., luminous efficiency and operating voltage.

The N-type charge generation layer 160N may be formed of a metal or an N-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be commonly-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1 and 8% relative to 100% for the host. The dopant may have a work function of 2.5 eV or higher. The host material may be an organic material that has hetero ring with 20 to 60 carbon atoms and the hetero ring having nitrogen-atom, for example, one material among tris(8-hydroxyquinoline)aluminum, triazine, a hydroxyquinoline derivative, a benzazole derivative, and a xylol derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be a material of $F_4$-TCNQ (2,3,5,6-tetrafluoro-7,7,8,8,-tetracyanoquinodemethane), a derivative of tetracyanoquinodemethane, iodine, $FeCl_3$, $FeF_3$, and $SbCl_5$. The host may be a material of NPB (N,N'-bis(naphthalene-1-yl)-N,N'-bis(phenyl)-benzidine), TPD(N,N'-bis-(3-methylphenyl)-N,N'-bis(phenyl)-benzidine), and TNB(N,N,N'N'-tetranaphthalenyl-benzidine).

The second light emitting part ST2 including a second light emitting layer 190 is over the charge generation layer 160. The second light emitting layer 190 may emit light of red, green, or blue, and it may be a yellow light emitting layer, for example, in this exemplary embodiment. The yellow light emitting layer may include a yellow-green light emitting layer, a green light emitting layer, or a multilayer structure of a yellow-green light emitting layer and a green light emitting layer. The second light emitting part ST2 further includes a second hole injection layer 170 and a second hole transport layer 180 that are between the charge generation layer 160 and the second light emitting layer 190. Also, the second light emitting part ST2 further includes a second electron transport layer 200 and an electron injection layer 210 that are over the second light emitting layer 190. Accordingly, the second light emitting part ST2 including the second hole injection layer 170, the second hole transport layer 180, the second light emitting layer 190, the second electron transport layer 200, and the electron injection layer 210 is formed over the charge generation layer 160. The cathode 220 is formed over the second light emitting part ST2, thereby constituting the organic light emitting display device according to the second exemplary embodiment of the present invention. The charge generation layer 160, the second hole injection layer 170, the second hole transport layer 180, the second light emitting layer 190, the second electron transport layer 200, and the electron injection layer 210 may be organic layers.

At least one among the first hole injection layer 120, the second hole injection layer 170, the first hole transport layer 130, the second hole transport layer 180, and the P-type charge generation layer 160P includes an indene carbonitrile compound, like the first exemplary embodiment. In the present invention, the LUMO energy level can be lowered by applying an indene carbonitrile compound including an indene carbonitrile substituent having a strong electron-attracting property, thereby helping hole injection from the anode into the light emitting layer. Also, if at least one among the hole injection layer 120, the second hole injection layer 170, the first hole transport layer 130, the second hole transport layer 180, and the P-type charge generation layer 160P includes a carbonitrile compound having an electron-attracting substituent so that the LUMO has a similar energy level to the HOMO, this facilitates the transfer of holes from the anode to the light emitting layer, thereby increasing luminous efficiency and reducing operating voltage. The electron-attracting substituent may include indene carbonitrile compound. The carbonitrile compound may include an indene carbonitrile compound. Accordingly, by applying an indene carbonitrile compound for a hole injection layer, a hole transport layer, or a P-type charge generation layer, electrons can be smoothly transferred from the anode to the light emitting layer, and this leads to a reduction in operating voltage.

Although the organic light emitting display device according to the second exemplary embodiment has been illustrated and described with an example where a hole injection layer includes an indene carbonitrile compound, an indene carbonitrile compound of the present invention may be applied for hole transport layers and a P-type charge generation layer as well. Also, an indene carbonitrile compound may be applied as a dopant for a hole injection layer, hole transport layers, and a P-type charge generation layer. Moreover, at least one among the hole injection layer, the hole transport layers, and the P-type charge generation layer has a host and a dopant, and the dopant allows for the formation of a hole transport path within the at least one among the hole injection layer, the hole transport layers, and the P-type charge generation layer because the LUMO of the dopant is similar in energy level to the HOMO of the host. This facilitates the transfer of holes to the light emitting layer, thereby reducing operating voltage.

Figure 3:
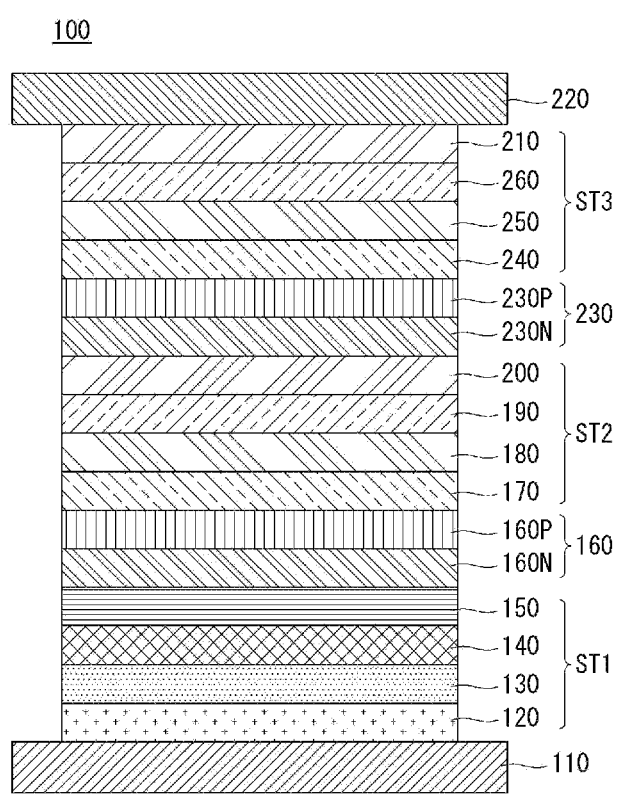
FIG. 3 is a cross-sectional view showing an organic light emitting display device according to a third exemplary embodiment of the present invention.

FIG. 3 is a view showing an organic light emitting display device according to a third exemplary embodiment of the present invention. The same elements as the first and second exemplary embodiments are denoted by the same reference numerals, so descriptions of these elements will be omitted below.

Referring to FIG. 3, an organic light emitting display device 100 of the present invention comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 is a single light emitting diode unit, and includes a first light emitting layer 140. The first light emitting layer 140 may emit light of red, green, or blue: for example, it may be a blue light emitting layer in this exemplary embodiment. The first light emitting part ST1 further includes a first hole injection layer 120 and a first hole transport layer 130 that are between the anode 110 and the first light emitting layer 140. Also, the first light emitting part ST1 further includes a first electron transport layer 150 over the first light emitting layer 140. Accordingly, the first light emitting part ST1 having the first hole injection layer 120, the first hole transport layer 130, the first light emitting layer 140, and the first electron transport layer 150 is formed over the anode 110. The first hole injection layer 120 and the first hole transport layer 130 may not be included in the composition of the first light emitting part ST1, depending on the structure or characteristics of the device. The first hole injection layer 120, the first hole transport layer 130, the first light emitting layer 140, and the first electron transport layer 150 may be organic layers.

The first charge generation layer 160 is over the first light emitting part ST1. The first charge generation layer 160 is a PN-junction charge generation layer, formed by joining an N-type charge generation layer 160N and a P-type charge generation layer 160P, which generates a charge, or injects the charge, i.e., electrons and holes, separately into the light emitting layers.

The second light emitting part ST2 including a second light emitting layer 190 is over the first charge generation layer 160. The second light emitting layer 190 may emit light of red, green, or blue, and it may be a yellow light emitting layer, for example, in this exemplary embodiment. The yellow light emitting layer may include a yellow-green light emitting layer, a green light emitting layer, or a multilayer structure of a yellow-green light emitting layer and a green light emitting layer. The second light emitting part ST2 further includes a second hole injection layer 170 and a second hole transport layer 180 that are between the first charge generation layer 160 and the second light emitting layer 190, and a second electron transport layer 200 over the second light emitting layer 190. Accordingly, the second light emitting part ST2 including the second hole injection layer 170, the second hole transport layer 180, the second light emitting layer 190, and the second electron transport layer 200 is formed over the first charge generation layer 160. The first charge generation layer 160, the second hole injection layer 170, the second hole transport layer 180, second light emitting layer 190, and the second electron transport layer 200 may be organic layers.

The second charge generation layer 230 is over the second light emitting part ST2. The second charge generation layer 230 is a PN-junction charge generation layer, formed by joining an N-type charge generation layer 230N and a P-type charge generation layer 230P, which generates a charge, or injects the charge, i.e., electrons and holes, separately into the light emitting layers. The N-type charge generation layer 230N has the same composition as the N-type charge generation layer 160N of the first charge generation layer 160, so its description will be omitted. The P-type charge generation layer 230P also has the same composition as the aforementioned P-type charge generation layer 160P of the first charge generation layer 160.

The third light emitting part ST3 including a third light emitting layer 250 is over the second charge generation layer 230. The third light emitting layer 250 may emit light of red, green, or blue: for example, it may be a blue light emitting layer in this exemplary embodiment. The blue light emitting layer includes a blue light emitting layer, a dark blue light emitting layer, or a sky blue light emitting layer. The third light emitting part ST3 further includes a third hole transport layer 240 between the second charge generation layer 230 and the third light emitting layer 250, and a third electron transport layer 260 and an electron injection layer 210 that are over the third light emitting layer 250. The third electron transport layer 260 has the same composition as the aforementioned first electron transport layer 150, so its description will be omitted. Accordingly, the third light emitting part ST3 including the third hole transport layer 240, the third light emitting layer 250, the third electron transport layer 260, and the electron injection layer 210 is formed over the second charge generation layer 230. The cathode 220 is formed over the third light emitting part ST3 to constitute the organic light emitting display device according to the third exemplary embodiment of the present invention. The second charge generation layer 230, the third light emitting layer 250, the third hole transport layer 240, the third electron transport layer 260, and the electron injection layer 210 may be organic layers.

In the third exemplary embodiment of the present invention, at least one among the first hole injection layer 120, the second hole injection layer 170, the first hole transport layer 130, the second hole transport layer 180, the third hole transport layer 240, the P-type charge generation layer 160P of the first charge generation layer 160, and the P-type charge generation layer 260P of the second charge generation layer 260 includes an indene carbonitrile compound, like the foregoing exemplary embodiments. In the present invention, the LUMO energy level can be lowered by applying to an indene carbonitrile compound including an indene carbonitrile substituent having a strong electron-attracting property, thereby facilitating hole injection from the anode into the light emitting layer. Also, if at least one among the first hole injection layer 120, the second hole injection layer 170, the first hole transport layer 130, the second hole transport layer 180, the third hole transport layer 240, the P-type charge generation layer 160P of the first charge generation layer 160, and the P-type charge generation layer 260P of the second charge generation layer 260 includes a carbonitrile compound having an electron-attracting substituent so that the LUMO has a similar energy level to the HOMO, this helps the transfer of holes from the anode to the light emitting layer, thereby increasing luminous efficiency and reducing operating voltage. The electron-attracting substituent may include the indene carbonitrile compound. The carbonitrile compound may include e an indene carbonitrile compound. Accordingly, by applying an indene carbonitrile compound for a hole injection layer, a hole transport layer, or a P-type charge generation layer, electrons can be smoothly transferred from the anode to the light emitting layer, thereby reducing operating voltage.

Although the organic light emitting display device according to the third exemplary embodiment has been illustrated and described with an example where a hole injection layer includes an indene carbonitrile compound, an indene carbonitrile compound of the present invention may be applied to hole transport layers and P-type charge generation layers as well. Also, an indene carbonitrile compound may be applied as a dopant for hole injection layers, the hole transport layers, and the P-type charge generation layers. Moreover, at least one among the hole injection layers, the hole transport layers, and the P-type charge generation layers has a host and a dopant, and the dopant allows for the formation of a hole transport path within the at least one among the hole injection layers, the hole transport layers, and the P-type charge generation layers because the LUMO of the dopant is similar in energy level to the HOMO of the host. This helps the transfer of holes to the light emitting layer, thereby reducing operating voltage.

Hereinafter, synthesis examples of indene carbonitrile compounds of the present invention and the properties of these compounds will be described in detail. However, the following examples are only for illustration, and the present invention is not limited thereto.

Synthesis of A-1

1) Preparation of 7-bromo-9-oxo-9H-fluorene-2-carbonitrile

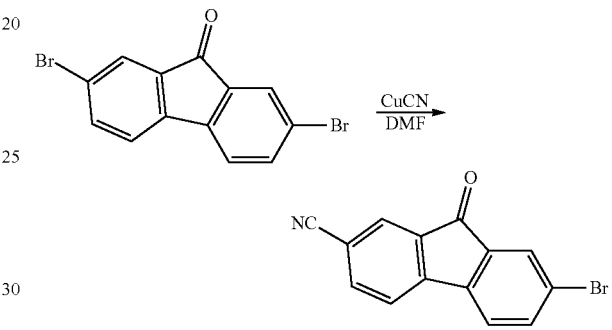

2,7-dibromo-9H-fluorene-9-one (0.148 mol), CuCN (0.148 mol), and 200 ml of dimethylformamide (DMF) were put into a 500 ml two-necked flask and stirred for 24 hours at about 160. After that, an organic layer was obtained by extraction with a $CH_2Cl_2$/aq.$NH_4Cl$ aqueous solution, dried with $MgSO_4$, and then subjected to column chromatography to give 35 g of solid (yield: 83%).

2) Preparation of 7-(2-(trimethylsilyl)ethynyl)-9-oxo-9H-fluorene-2-carbonitrile

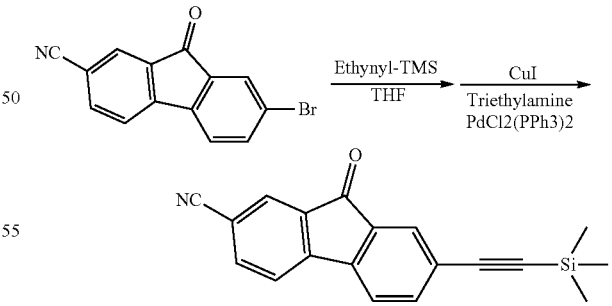

7-bromo-9-oxo-9H-fluorene-2-carbonitrile (0.035 mol), ethynyl-trimethylsilane (0.053 mol), and 100 ml of tetrahydrofurane (THF) were put into a 250 ml two-necked flask and stirred for 30 minutes, and then CuI (1.76 mmol) was added to the mixture and stirred for 30 minutes. Triethylamine (0.106 mol) and $PdCl_2(PPh_3)_2$ (1.76 mmol) were added to the mixture and stirred for 3 hours, and then the solvent was completely removed. After that, the mixture was dissolved in $CH_2Cl_2$ and subjected to column chromatography to give 9.5 g of solid (yield: 90%).

3) Preparation of
7-ethynyl-9-oxo-9H-fluorene-2-carbonitrile

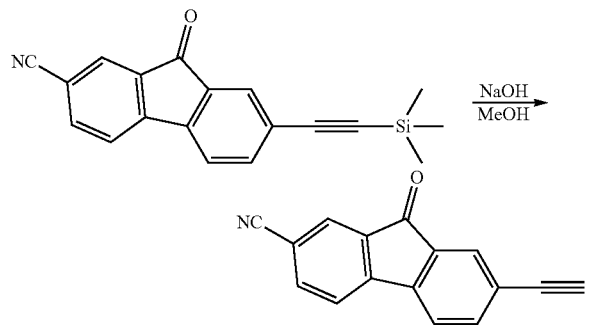

7-(2-(trimethylsily)ethynyl)-9-oxo-9H-fluorene-2-carbonitrile (0.032 mol) and NaOH (0.038 mol) were put into a 250 ml two-necked flask and stirred for 5 hours at ambient temperature, and then the solvent was removed. After that, an organic layer was obtained by extraction with a $CH_2Cl_2$/aq.$NH_4Cl$ aqueous solution, dried with $MgSO_4$, and then subjected to column chromatography to give 6.9 g of solid (yield: 95%).

4) Preparation of 7-(2-(2-(cyanomethyl)phenyl)ethynyl)-9-oxo-9H-fluorene-2-carbonitrile

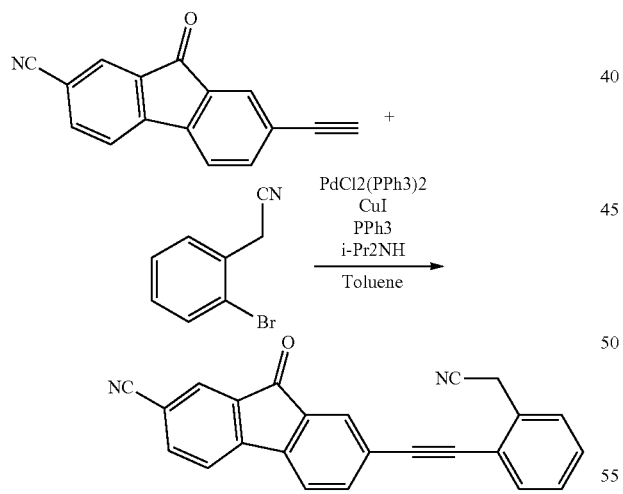

(2-bromophenyl)acetonitrile (0.036 mol), $PdCl_2(PPh_3)_2$ (0.6 mmol), CuI (0.6 mmol), triphenyphosphine ($PPh_3$) (1.2 mmol), and i-$Pr_2NH$ (0.060 mol) were put into a 250 ml two-necked flask and stirred for 5 minutes at ambient temperature. Then, 7-ethynyl-9-oxo-9H-fluorene-2-carbonitrile (0.03 mol) was put into the two-necked flask and stirred for 24 hours at 50. After that, an organic layer was obtained by extraction with water/ethyl acetate (EA), dried with $MgSO_4$, and then subjected to column chromatography to give 7.4 g of solid (yield: 72%).

5) Preparation of 7-(3-cyano-1-oxo-1H-inden-2-yl)-9-oxo-9H-fluorene-2-carbonitrile

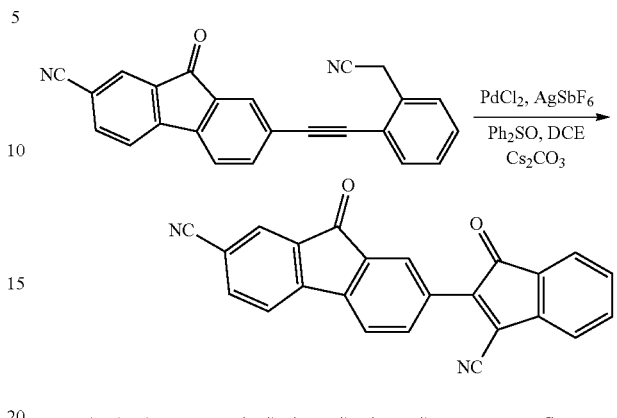

7-(2-(2-(cyanomethyl)phenyl)ethynyl)-9-oxo-9H-fluorene-2-carbonitrile (0.021 mol), $PdCl_2$ (2.14 mmol), $AgSbF_6$ (3.29 mmol), and $Ph_2SO$ (0.064 mol) were dissolved in 1,2-dichloroethane (DCE) in a 250 ml two-necked flask and stirred for 24 hours at 60, and then $Cs_2CO_3$ (0.026 mol) was added to the mixture and stirred for 12 hours. After completion of the reaction, a product was obtained by extraction with $CH_2Cl_2$, followed by the complete evaporation of $CH_2Cl_2$, and then the product was put into 35% HCl and stirred for 2 hours. After that, an organic layer was obtained by extraction with a $CH_2Cl_2$/aq.$NH_4Cl$ aqueous solution, dried with $MgSO_4$, and then subjected to column chromatography to give 3.3 g of solid (yield: 43%).

6) Preparation of 7-(3-cyano-1-(dicyanomethylene)-1H-inden-2-yl)-9-(dicyanomethylene)-9H-fluorene-2-carbonitrile

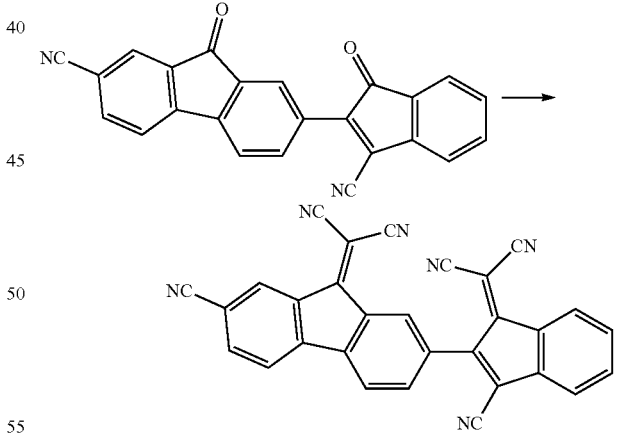

7-(3-cyano-1-oxo-1H-inden-2-yl)-9-oxo-9H-fluorene-2-carbonitrile (8.37 mmol), malononitrile (0.033 mol), and $CH_2Cl_2$ were put into a 100 ml two-necked flask and stirred for 30 minutes under an argon atmosphere. $TiCl_4$ (0.033 mol) was slowly put into the mixture, and the pyridine (0.067 mol) was added to the mixture and stirred at ambient temperature. After completion of the reaction, an organic layer was obtained by extraction with a $CH_2Cl_2$/aq.$NH_4Cl$ aqueous solution, dried with $MgSO_4$, and then subjected to column chromatography to give 1.78 g of solid compound A-1 (yield: 46%).

The HOMO and LOMO energy levels of the prepared compounds A-1, NPD, HAT-CN, and F$_4$-TCNQ were shown in the following Table 1.

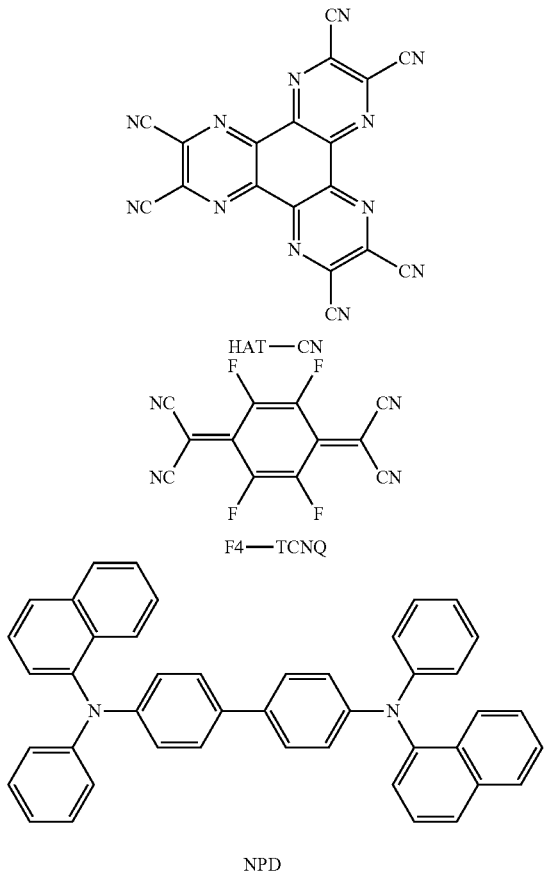

TABLE 1

|  | HOMO Energy Level (eV) | LUMO Energy Level (eV) |
| --- | --- | --- |
| NPD | −5.45 | −2.30 |
| HAT-CN | −9.55 | −6.07 |
| F$_4$-TCNQ | −8.33 | −5.78 |
| A-1 | −7.62 | −5.54 |

Referring to Table 1, NPD used for a hole transport layer showed a HOMO energy level of −5.45 eV and an LUMO energy level of −2.30 eV. HAT-CN used as a dopant of a hole injection layer showed a HOMO energy level of −9.55 eV and an LUMO energy level of −6.07 eV, and F$_4$-TCNQ showed a HOMO energy level of −8.33 eV and an LUMO energy level of −5.78 eV. The compound A-1 of the present invention showed a HOMO energy level of −7.62 eV and an LUMO energy level of −5.54 eV.

From these results, it can be found out that the LUMO energy level of the compound A-1 of the present invention is lower than the HOMO energy level of NPD used for a hole transport layer. Also, it can be found out that the LUMO energy level of the compound A-1 of the present invention is closer to the HOMO energy level of NPD than to the LUMO energy levels of HAT-CN and F$_4$-TCNQ used as a dopant for a hole injection layer.

Figure 4:
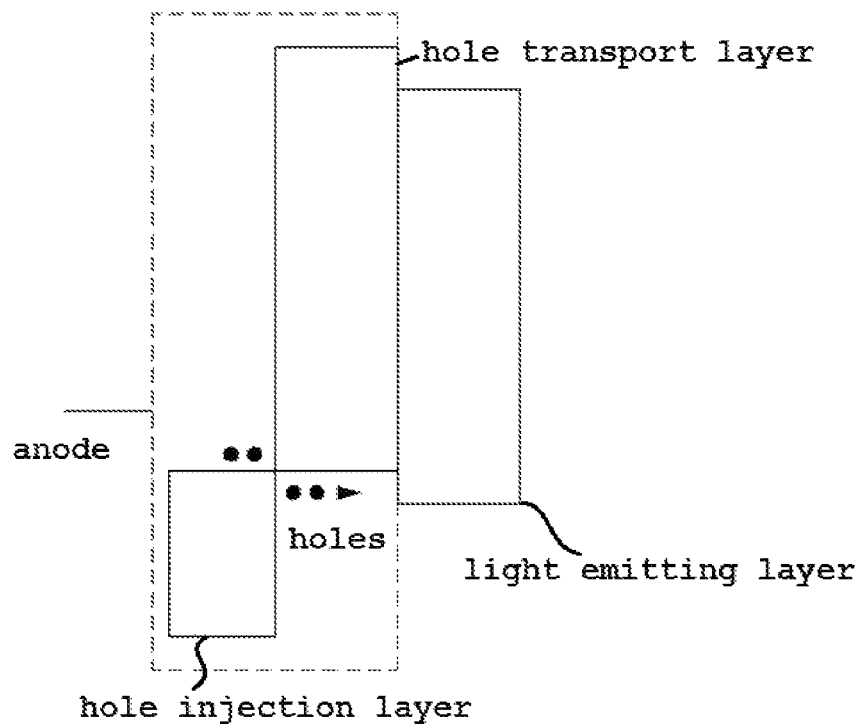
FIGS. 4 and 5 are energy band diagrams of an organic light emitting display device according to exemplary embodiments of the present invention.
Figure 5:
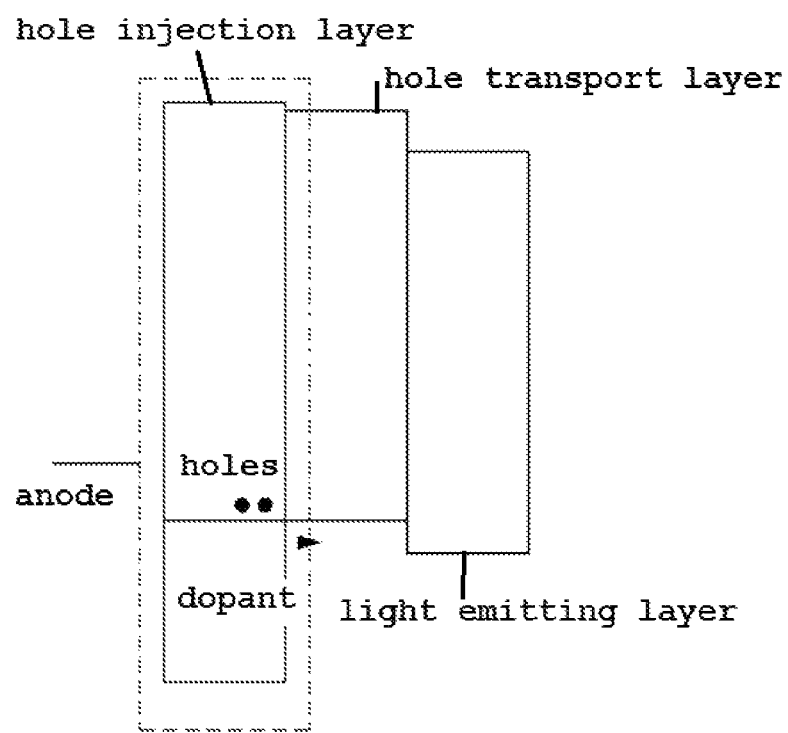

FIGS. 4 and 5 are energy band diagrams of an organic light emitting display device according to exemplary embodiments of the present invention. Referring to FIG. 4, an anode, a hole injection layer, and a hole transport layer are depicted. The hole injection layer is formed of the compound A-1 of the present invention, and the hole transport layer is formed of, for example, NPD. Since the LUMO of the compound A-1 for the hole injection layer is similar in energy level to the HOMO of NPD for the hole transport layer, electrons are accepted from the HOMO energy level of the hole transport layer to the LUMO energy level of the compound A-1, thereby forming a hole transport path. The compound in the hole injection layer allows for the formation of a hole transport path between the hole injection layer and a hole transport layer neighboring the hole injection layer, because the LUMO is similar in energy level to the HOMO of the hole transport layer. Accordingly, holes can be smoothly injected from the hole injection layer into the hole transport layer through the hole transport path between the hole injection layer and the hole transport layer.

Referring to FIG. 5, the hole injection layer has a host and a dopant, and the compound A-1 of the present invention acts as the dopant. Since the LUMO of the compound A-1 as the dopant of the hole injection layer is similar in energy level to the HOMO of the host, electrons are accepted from the HOMO energy level of the host to the LUMO energy level of the compound A-1, thereby forming a hole transport path. The dopant allows for the formation of a hole transport path within the hole injection layer because the LUMO is similar in energy level to the HOMO of the host for the hole transport layer. Accordingly, holes can be smoothly injected from the hole injection layer into the hole transport layer through the hole transport path between the HOMO of the host and the LUMO of the compound A-1, within the hole injection layer. As a result, the use of the compound A-1 for a hole injection layer of the present invention helps the transfer of holes from the hole injection layer into the hole transport layer, thereby reducing operating voltage.

Hereinafter, embodiments for manufacturing an organic light emitting display device using the compound A-prepared in the foregoing synthesis examples will be disclosed. It should be noted that the thicknesses or formation conditions of the following organic layers do not limit the scope of the present invention.

Comparative Example 1

A device having a hole injection layer, a hole transport layer, an light emitting layer, an electron transport layer, an electron injection layer, and a cathode was formed on a substrate. The hole injection layer was formed of HAT-CN with a thickness of 100 Å. The device used in testing was a mono device.

Comparative Example 2

The organic light emitting display device has the same composition as Comparative Example 1, and the hole injection layer was formed of NPD with a thickness of 100 Å.

Embodiment 1

The organic light emitting display device has the same composition as Comparative Example 1, and the hole injection layer was formed with a thickness of 100 Å by doping NPD with the compound A-1 at a 5% doping concentration.

Embodiment 2

The organic light emitting display device has the same composition as Comparative Example 1, and the hole injection layer was formed with a thickness of 100 Å by doping NPD with the compound A-1 at a 10% doping concentration.

The materials for the hole injection layer used in the above Comparative Examples 1 and 2 and Embodiments 1 and 2 do not limit the scope of the present invention.

The operating voltage, luminous efficiency, and quantum efficiency of the organic light emitting display devices according to Comparative Examples 1 and 2 and Embodiments 1 and 2 were measured and shown in the following Table 2 (The devices were driven at an operating current of 10 mA/cm$^2$).

TABLE 2

|  | Operating voltage (V) | Luminous efficiency (Cd/A) | Quantum efficiency (%) |
| --- | --- | --- | --- |
| Comparative Example 1 | 4.13 | 3.8 | 4.4 |
| Comparative Example 2 | 4.67 | 3.8 | 4.3 |
| Embodiment 1 | 4.03 | 3.8 | 4.4 |
| Embodiment 2 | 4.03 | 3.8 | 4.3 |

Referring to Table 2, as compared to Comparative Example 1 using HAT-CN for a hole injection layer, Embodiment 1 using NPD doped with the compound A-1 at a 5% doping concentration showed a 0.1 V decrease in operating voltage and the same levels of luminous efficiency and quantum efficiency, and Embodiment 2 using NPD doped with the compound A-1 at a 10% doping concentration showed a 0.1 V decrease in operating voltage and similar levels of luminous efficiency and quantum efficiency.

Also, as compared to Comparative Example 2 using NPD for a hole injection layer, Embodiment 1 using NPD doped with the compound A-1 at a 5% doping concentration showed a 0.64 V decrease in operating voltage and the same levels of luminous efficiency and quantum efficiency, and Embodiment 2 using NPD doped with the compound A-1 at a 10% doping concentration showed a 0.64 V decrease in operating voltage and the same levels of luminous efficiency and quantum efficiency.

From these results, it can be found out that the doping of a hole injection layer with an indene carbonitrile compound can achieve a reduction in operating voltage while maintaining the same levels of luminous efficiency and quantum efficiency. Accordingly, it can be concluded that an organic light emitting display device using a compound of the present invention can reduce its operating voltage, as compared to an organic light emitting display device for which the compound of the present invention is not used.

As discussed above, in the present invention, the LUMO energy level can be lowered by the introduction of an indene carbonitrile compound comprising an indene carbonitrile substituent having a strong electron-attracting property, thereby facilitating hole injection from the anode into the light emitting layer. Accordingly, by using an indene carbonitrile compound for a hole injection layer, a hole transport layer, or a P-type charge generation layer, electrons can be smoothly transferred from the anode to the light emitting layer, thereby reducing operating voltage.

It will be apparent to those skilled in the art that various modifications and variations can be made in the organic light emitting display device of the present invention without departing from the spirit or scope of the invention. Thus, it is intended that the present invention cover the modifications and variations of the present invention provided they come within the scope of the appended claims and their equivalents.

What is claimed is:

1. An organic light emitting display device comprising:
   a hole injection layer over an anode;
   a hole transport layer over the hole injection layer;
   an light emitting layer over the hole transport layer; and
   a cathode over the light emitting layer,
   wherein at least one of the hole injection layer and the hole transport layer comprises one of the following compounds:

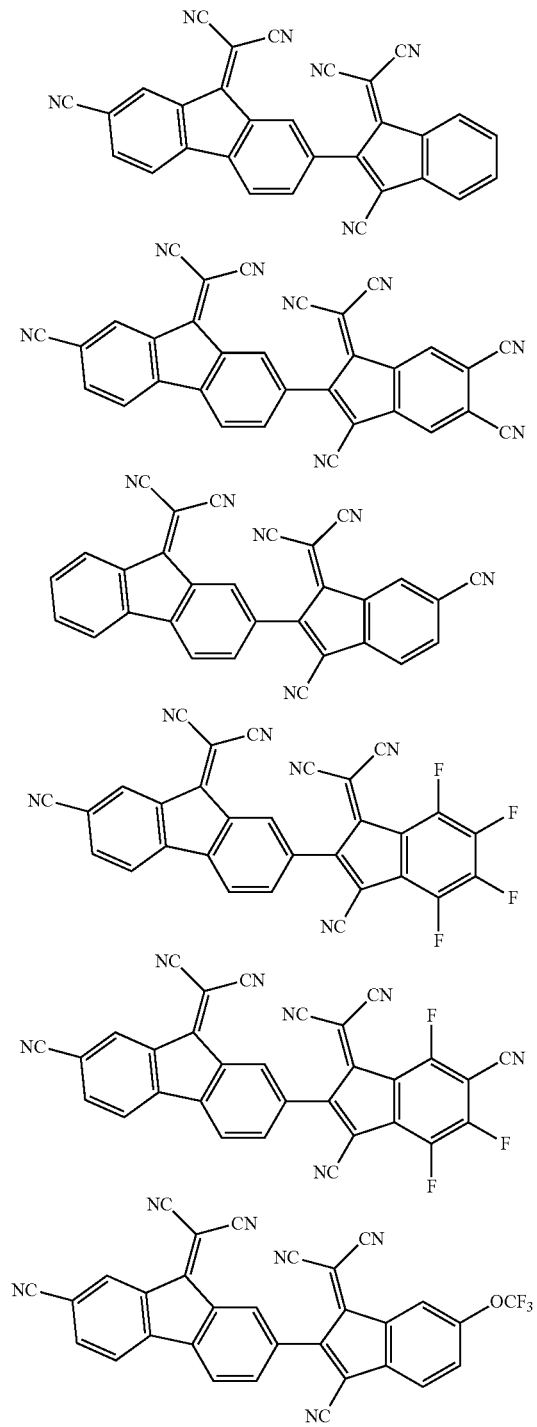

49
-continued
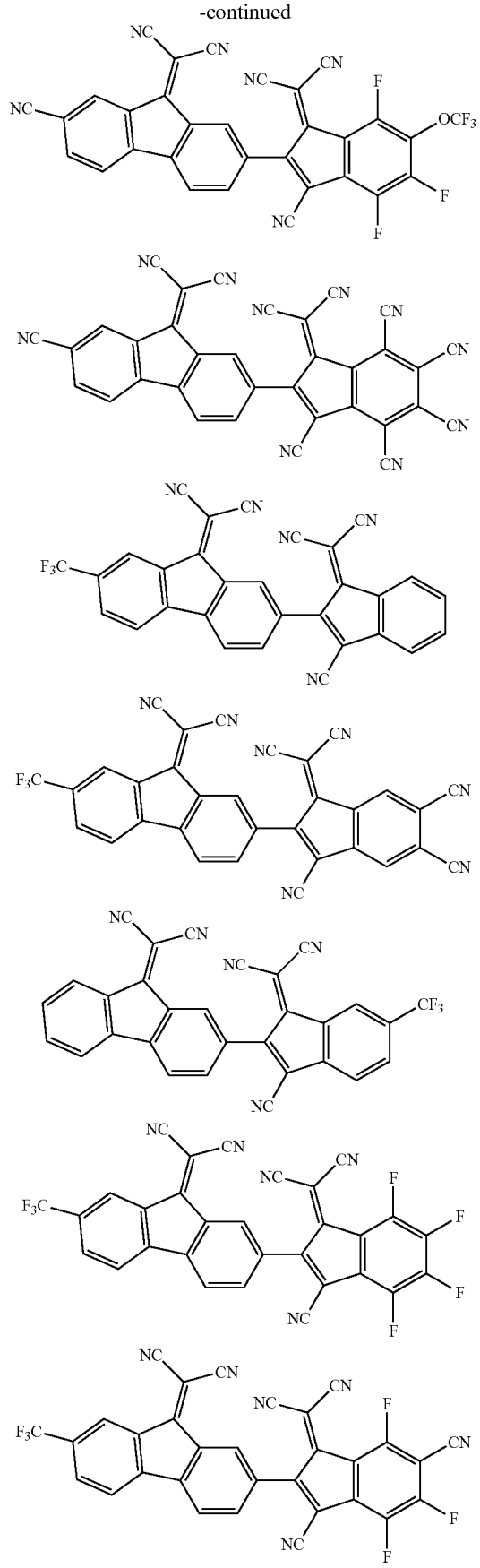
50
-continued
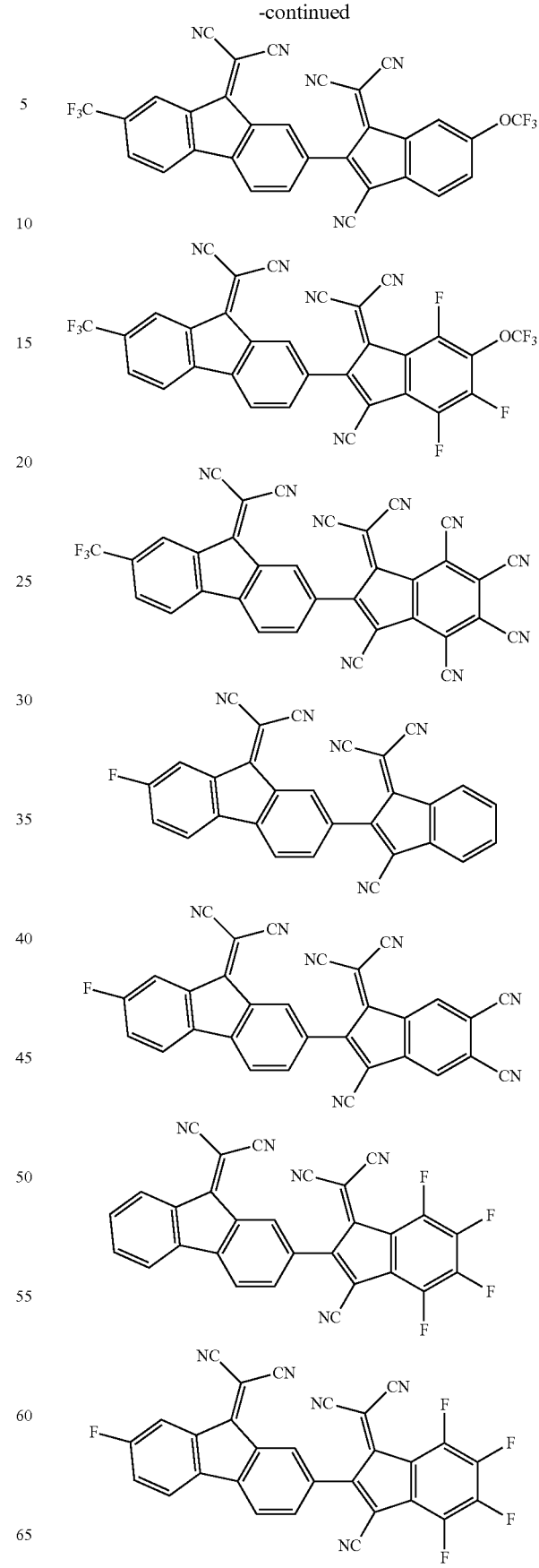

51
-continued
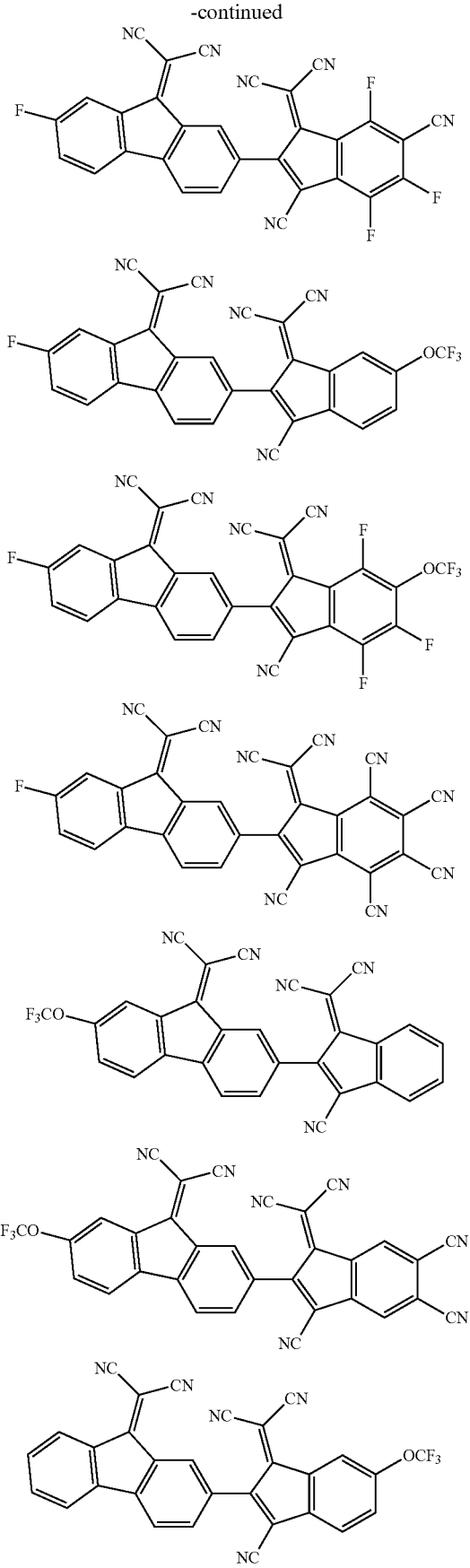
52
-continued
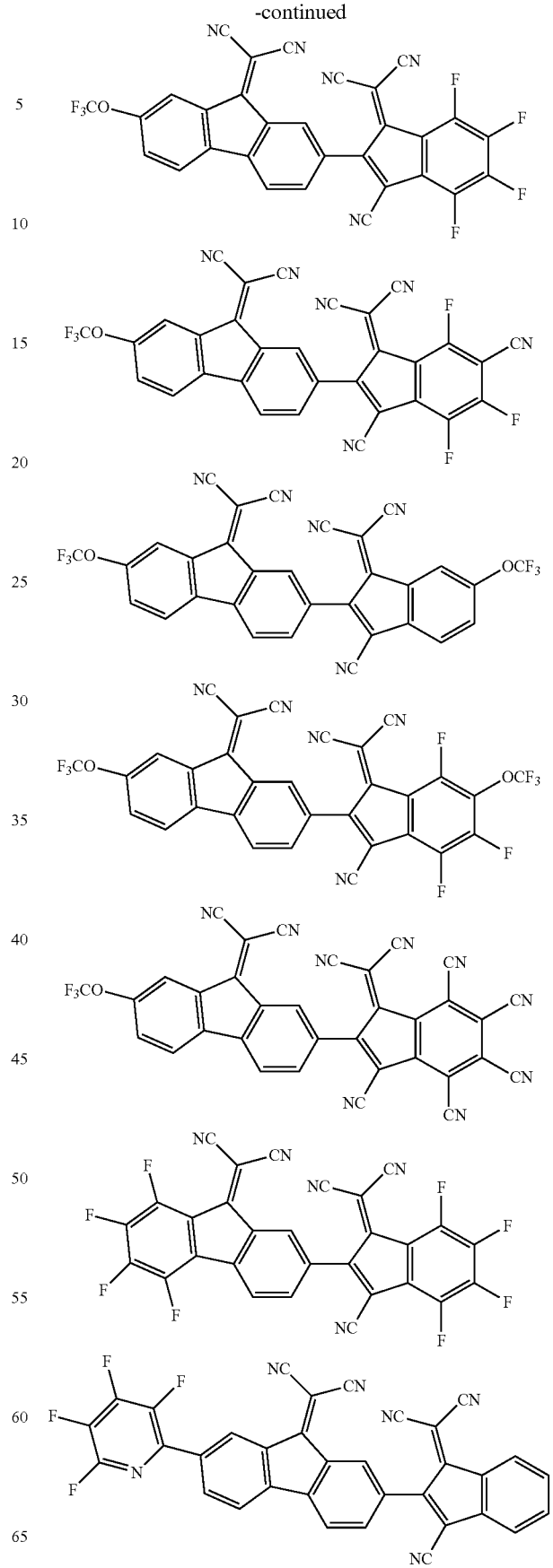

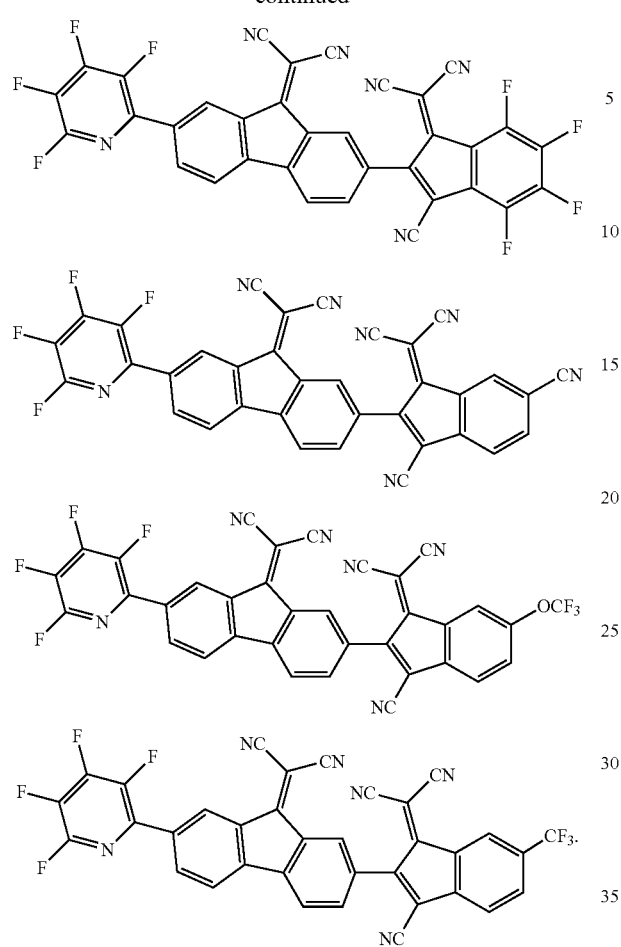

2. An organic light emitting display device comprising:
a first light emitting part between an anode and a cathode, the first light emitting part having a hole injection layer, a first hole transport layer, and a first light emitting layer;
a second light emitting part over the first light emitting part, the second light emitting part having a second hole transport layer and a second light emitting layer; and
a first charge generation layer between the first light emitting part and the second light emitting part, the first charge generation layer having a P-type charge generation layer, wherein at least one of the hole injection layer, the first hole transport layer, the second hole transport layer, and the P-type charge generation layer comprises one of the following compounds:

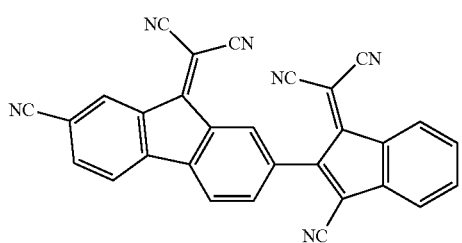

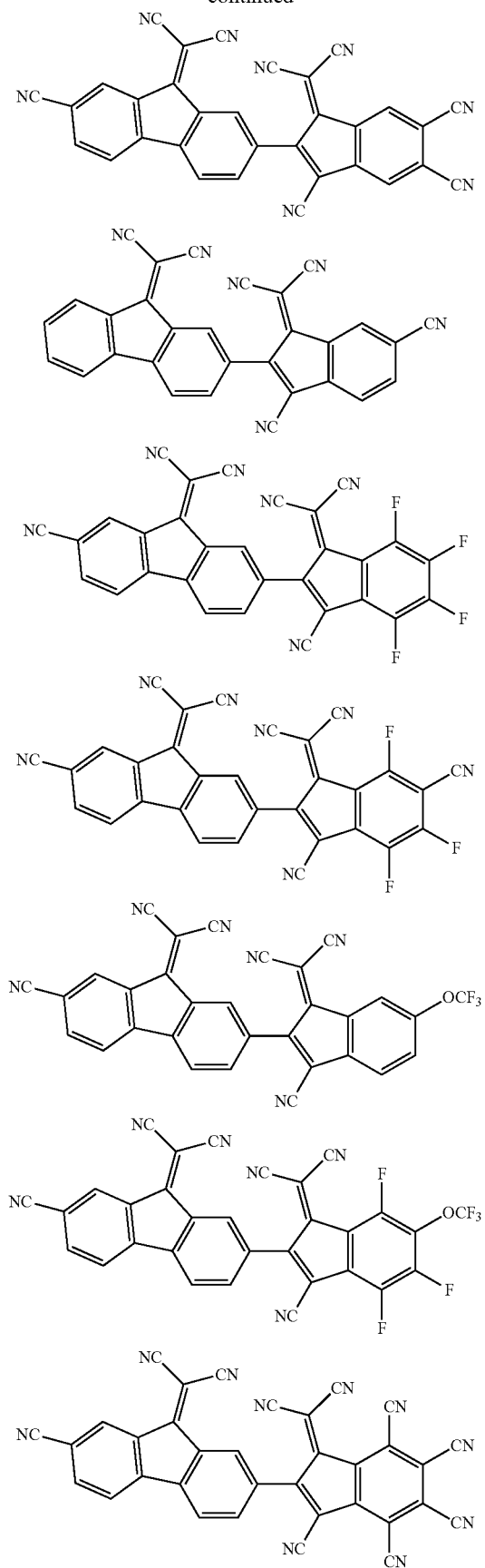

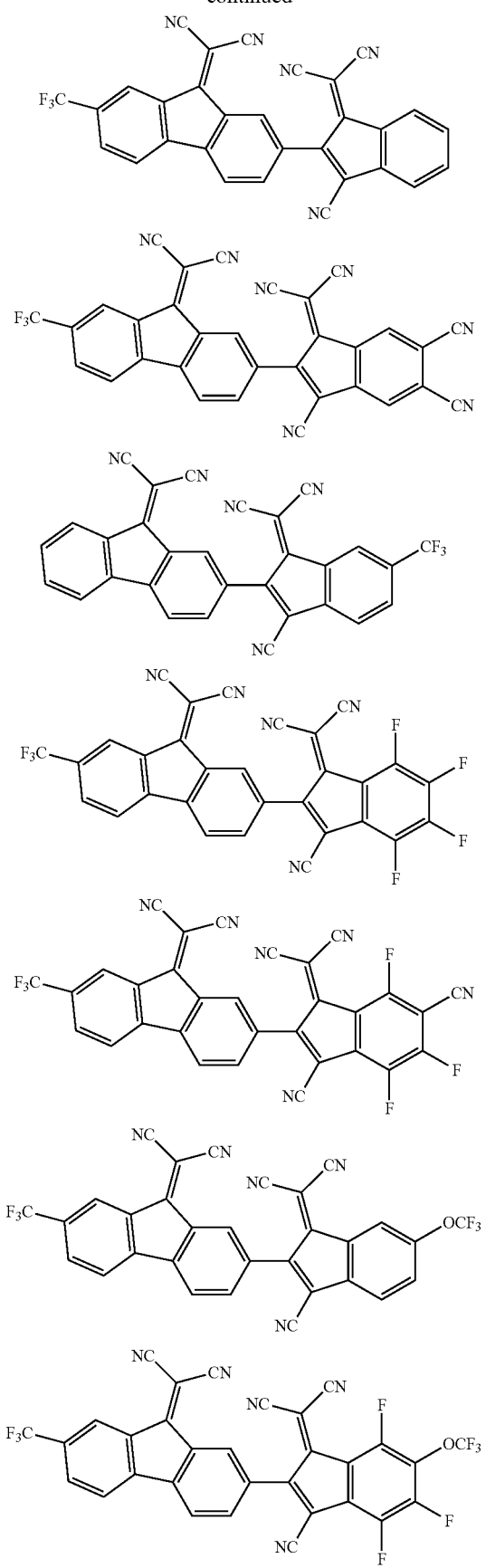
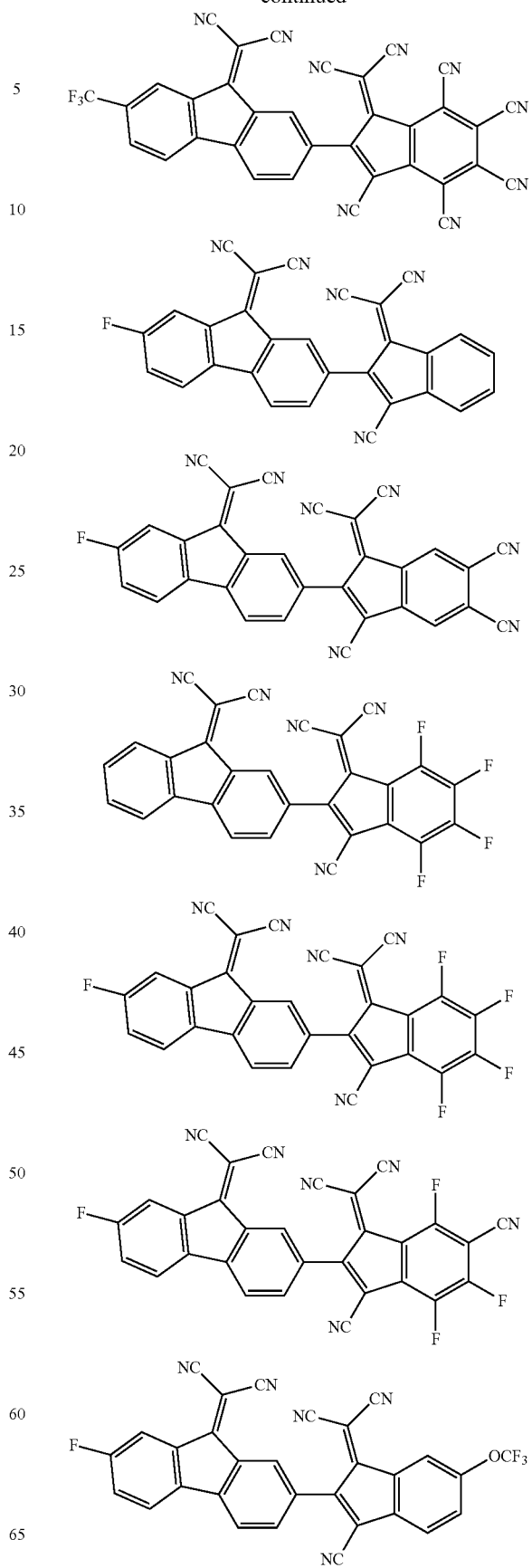

57
-continued
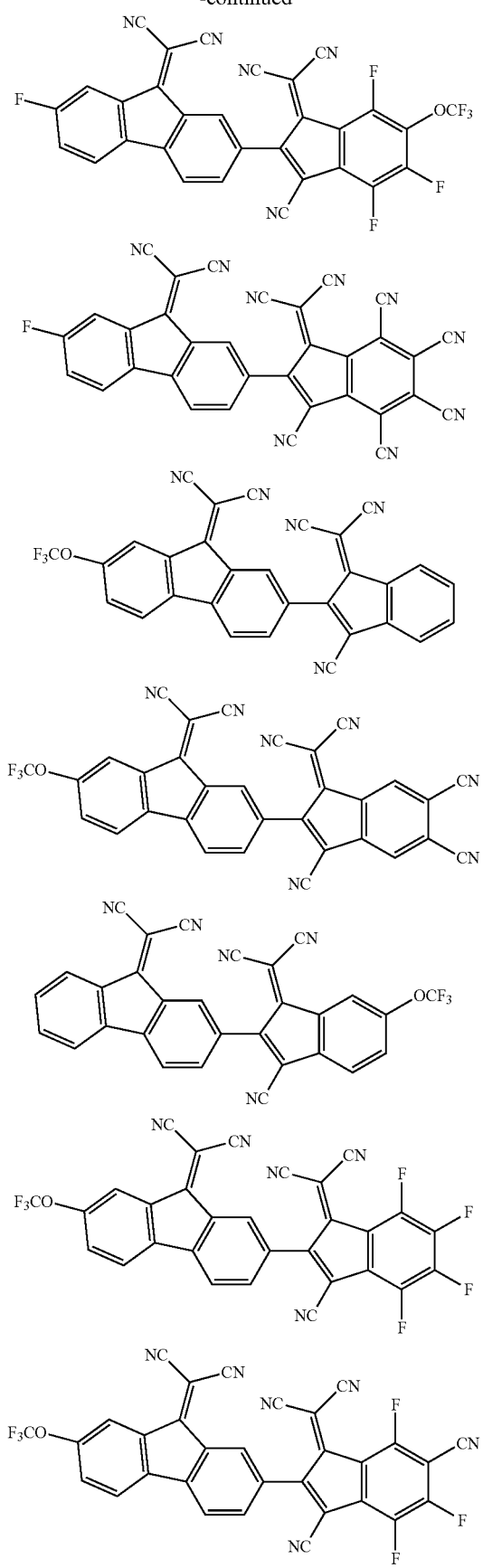
58
-continued
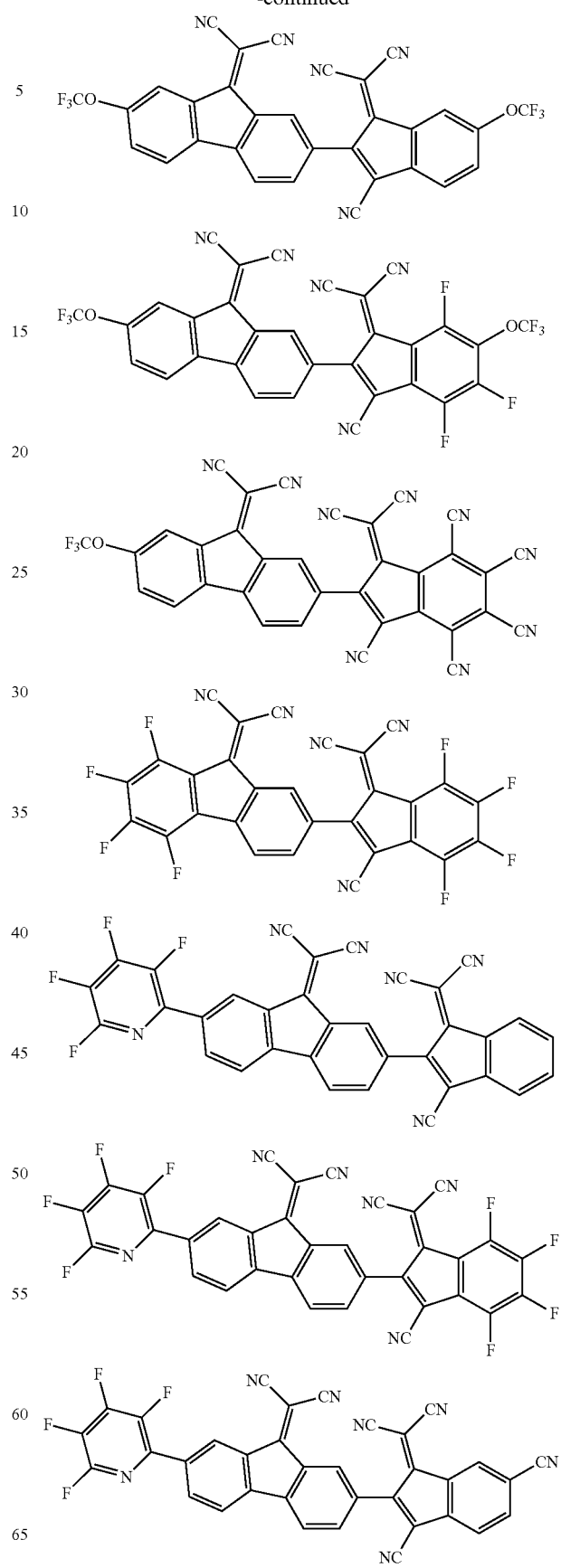

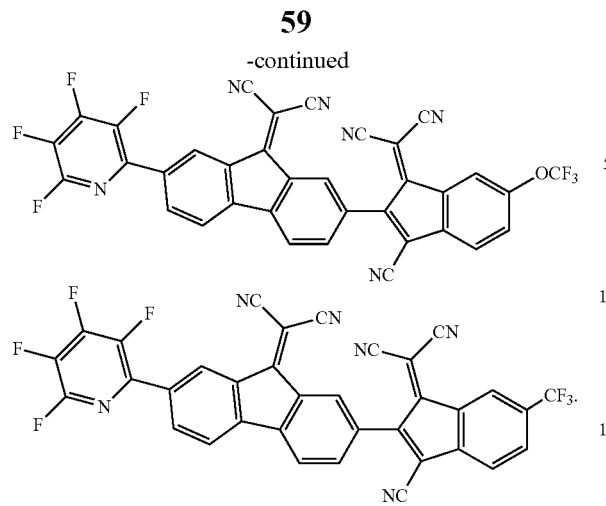

3. The organic light emitting display device of claim 2, further comprising:
   a third light emitting part over the second light emitting part, the third light emitting part having a third hole transport layer and a third light emitting layer; and
   a second charge generation layer between the second light emitting part and the third light emitting part, the second charge generation layer having a P-type charge generation layer,
   wherein at least one of the third hole transport layer and the P-type charge generation layer of the second charge generation layer comprises one of the compounds.

4. An organic light emitting display device comprising:
   an organic layer over an anode, the organic layer comprising a hole injection layer, a hole transport layer or a P-type charge generation layer; and
   a cathode over the organic layer,
   wherein the organic layer further comprises an indene carbonitrile compound, and
   wherein the organic light emitting display device comprising the indene carbonitrile compound has a reduced operating voltage compared to an organic light emitting display device without the indene carbonitrile compound.

5. The organic light emitting display device of claim 4, wherein the hole injection layer comprises the indene carbonitrile compound.

6. The organic light emitting display device of claim 4, wherein at least one of the hole injection layer, hole transport layer and P-type hole injection layer comprises a host and the indene carbonitrile compound.

7. The organic light emitting display device of claim 4, wherein at least one of the hole injection layer, the hole transport layer the and P-type charge generation layer comprises the indene carbonitrile compound.

8. The organic light emitting display device of claim 4, wherein the indene carbonitrile compound comprises one of the following compounds:

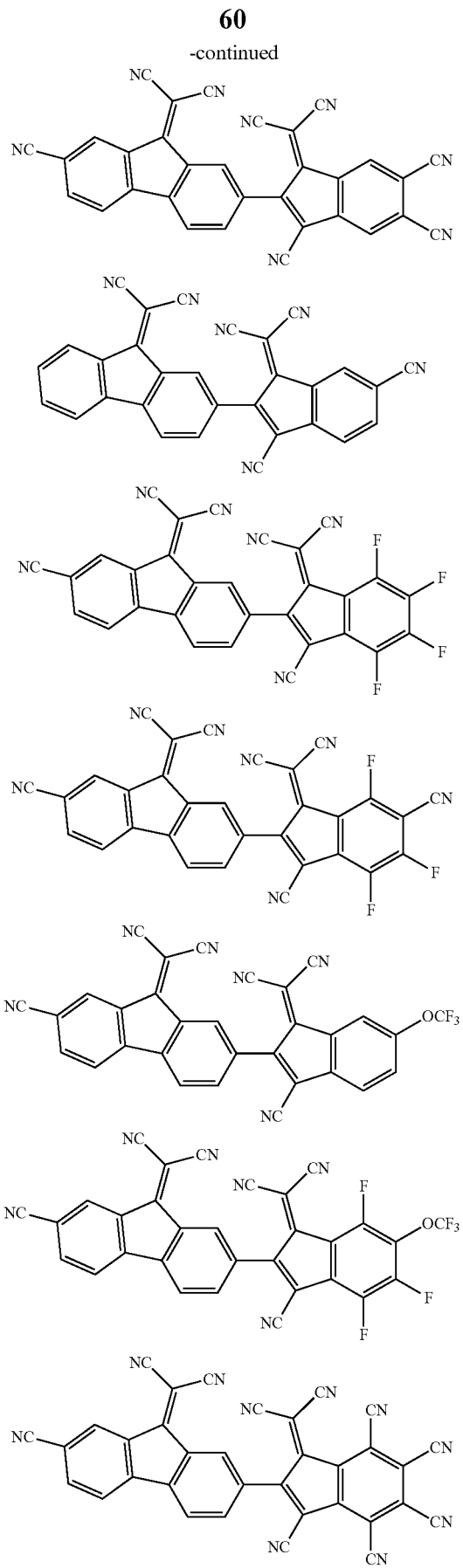

61
-continued
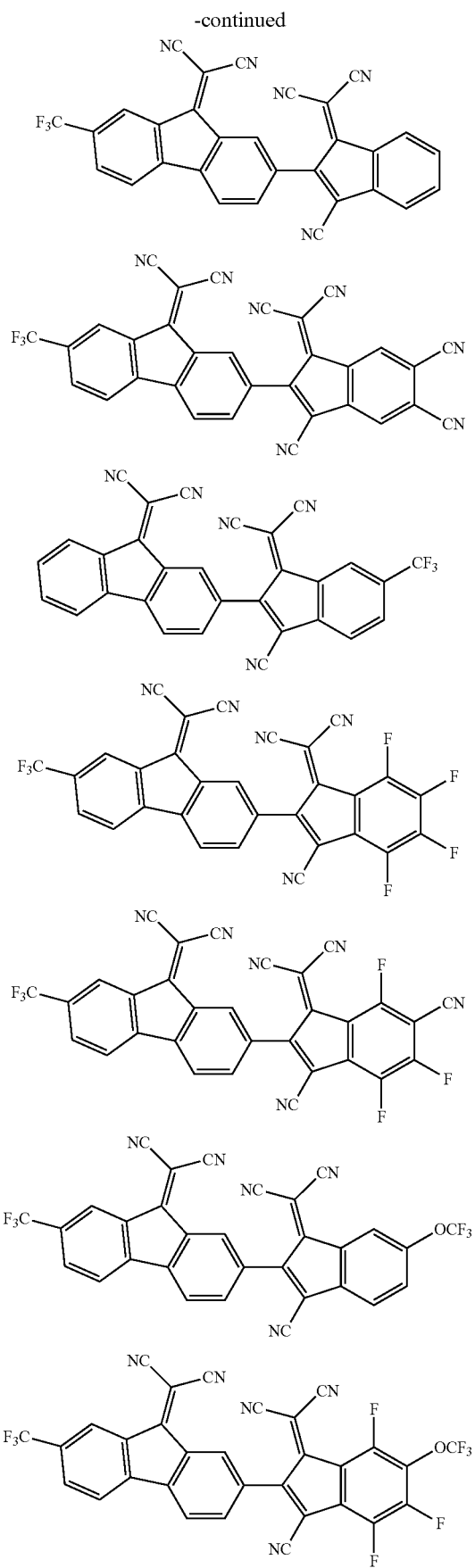
62
-continued
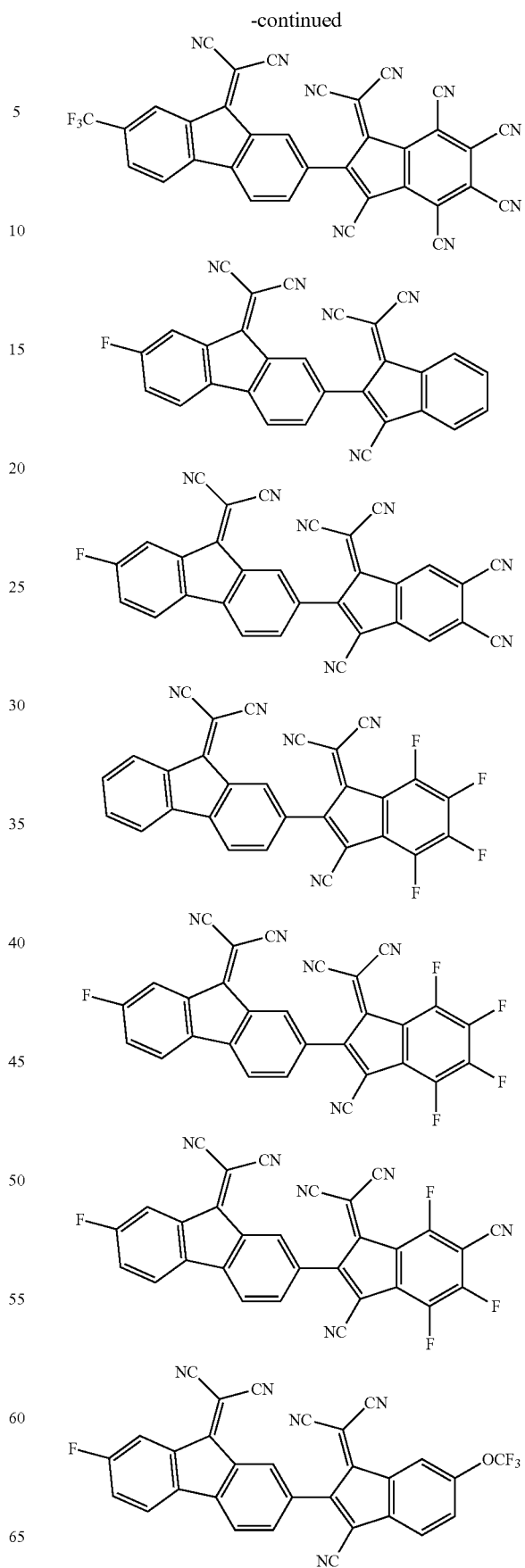

63
-continued
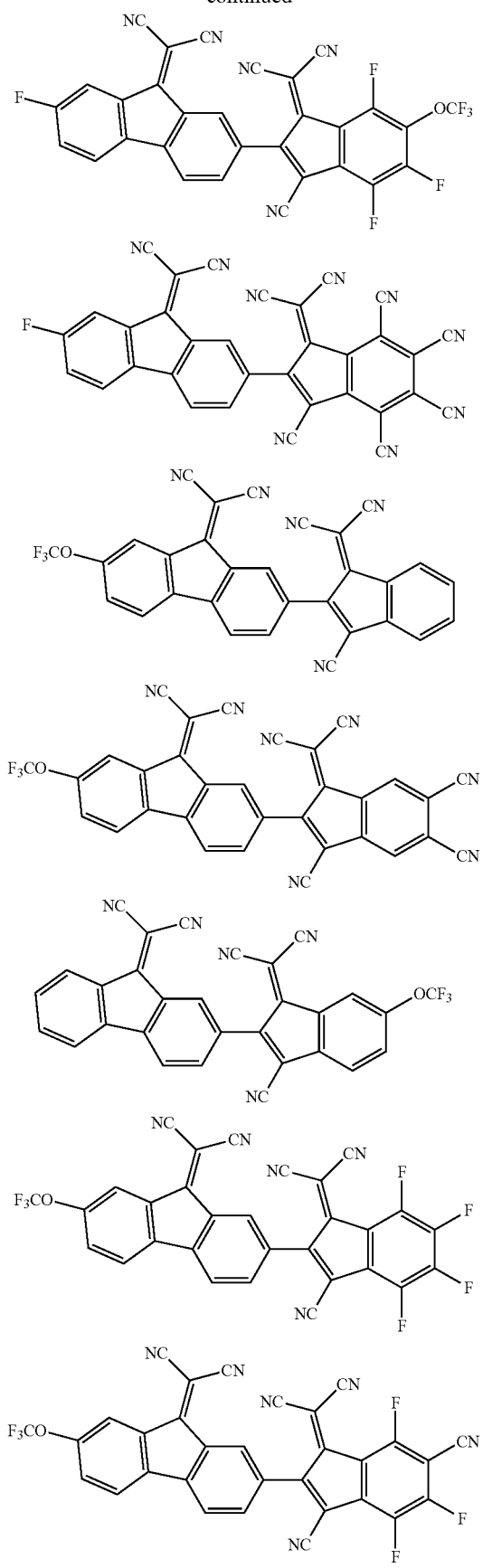
64
-continued
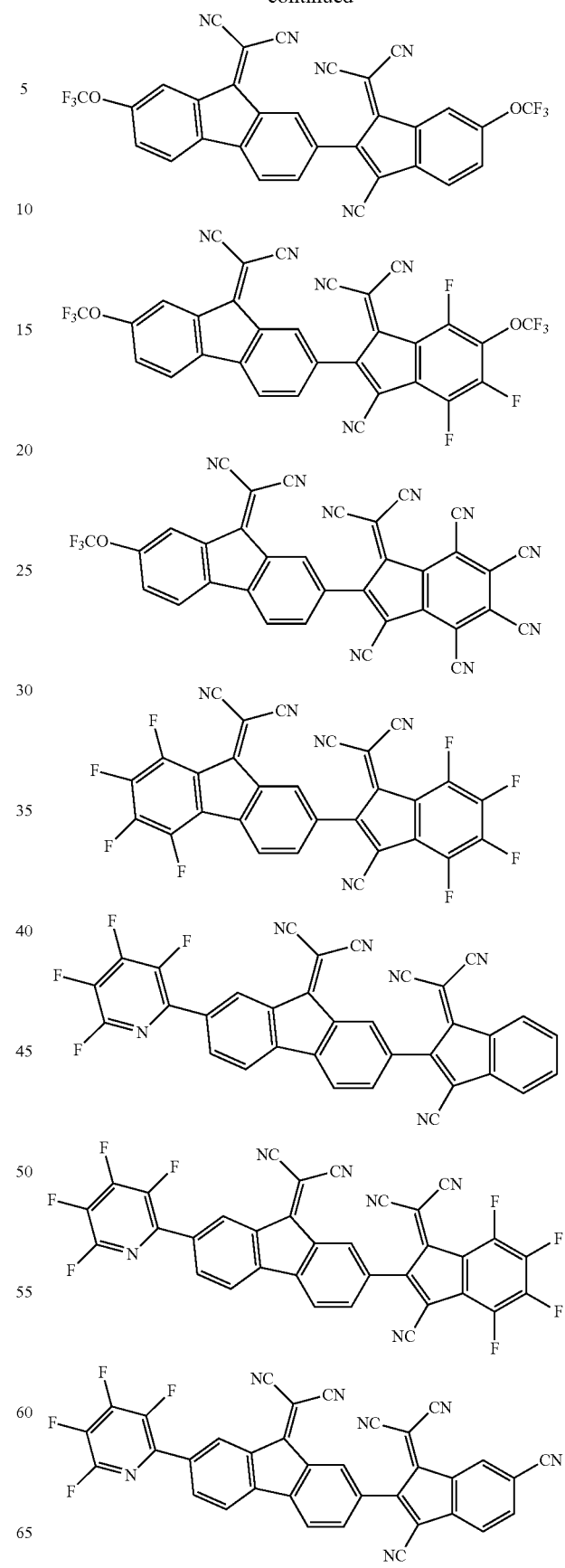

-continued
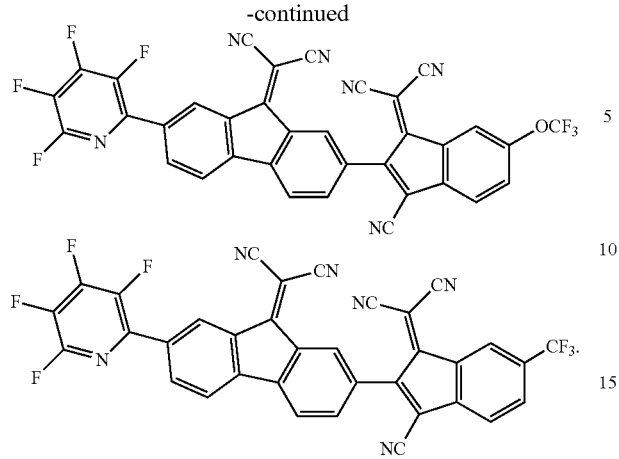
* * * * *